(12) United States Patent
Whang et al.

(10) Patent No.: US 8,735,962 B2
(45) Date of Patent: May 27, 2014

(54) SEMICONDUCTOR DEVICE AND METHOD OF MANUFACTURING THE SAME

(75) Inventors: Sung Jin Whang, Yongin-si (KR); Dong Sun Sheen, Yongin-si (KR); Seung Ho Pyi, Yongin-si (KR); Min Soo Kim, Guri-si (KR)

(73) Assignee: SK Hynix Inc., Gyeonggi-do (KR)

( * ) Notice: Subject to any disclaimer, the term of this patent is extended or adjusted under 35 U.S.C. 154(b) by 24 days.

(21) Appl. No.: 13/599,680

(22) Filed: Aug. 30, 2012

(65) Prior Publication Data

US 2013/0049095 A1    Feb. 28, 2013

(30) Foreign Application Priority Data

Aug. 31, 2011   (KR) .................. 10-2011-0087668

(51) Int. Cl.
*H01L 29/788*    (2006.01)
*H01L 21/20*    (2006.01)

(52) U.S. Cl.
USPC .................. 257/321; 257/E29.3; 257/E21.09

(58) Field of Classification Search
CPC ............ H01L 27/11582; H01L 29/7926; H01L 27/11556; H01L 29/66833; H01L 27/115; H01L 27/11578; H01L 29/78; H01L 29/7889; H01L 27/11565; H01L 27/11573; H01L 27/1157; H01L 21/28282; H01L 27/11568
USPC ................................ 257/321, E29.3, E21.09
See application file for complete search history.

(56) References Cited

U.S. PATENT DOCUMENTS

2009/0121271 A1*   5/2009   Son et al. ............. 257/315

FOREIGN PATENT DOCUMENTS

KR    1020110015339 A    2/2011
WO    WO 2011/142458 A1 *  11/2011

* cited by examiner

*Primary Examiner* — Matthew W Such
*Assistant Examiner* — Monica D Harrison
(74) *Attorney, Agent, or Firm* — William Park & Associates Patent Ltd.

(57) ABSTRACT

A semiconductor device according to an embodiment of the present invention includes a vertical channel layer protruding upward from a semiconductor substrate, a tunnel insulating layer covering a sidewall of the vertical channel layer, a plurality of floating gates separated from each other and stacked one upon another along the vertical channel layer, and surrounding the vertical channel layer with the tunnel insulating layer interposed therebetween, a plurality of control gates enclosing the plurality of floating gates, respectively, and an interlayer insulating layer provided between the plurality of control gates.

7 Claims, 24 Drawing Sheets

SEMICONDUCTOR DEVICE AND METHOD OF MANUFACTURING THE SAME

CROSS-REFERENCE TO RELATED APPLICATION

The present application claims priority to Korean patent application number 10-2011-0087668 filed on Aug. 31, 2011, in the Korean Intellectual Property Office, the entire disclosure of which is incorporated by reference herein.

BACKGROUND

1. Field of Invention

Example embodiments of the present invention relate to a semiconductor device and a method of manufacturing the same, more particularly, to a three-dimensional floating gate NAND flash memory device and a method of manufacturing the same.

2. Description of Related Art

A semiconductor device may include memory cells that are arranged in two dimensions on a semiconductor substrate. The integration of memory cells has been increased by reducing memory cell size within a predetermined area of a semiconductor substrate in order to achieve a high level of integration of a semiconductor device. However, a reduction in the size of memory cells is reaching physical limits. To overcome these physical limits, a semiconductor device having a three-dimensional structure in which memory cells are arranged in three dimensions has been developed.

A three-dimensional structured semiconductor device can efficiently utilize the area of a semiconductor substrate and improve the degree of integration as compared with a semiconductor device that has memory cells arranged in two dimensions. In particular, there are ongoing attempts to uniformly arrange memory cells in a NAND flash memory device, which is appropriately designed to achieve a high level of integration, in a three-dimensional structure.

According to a method of manufacturing a conventional three-dimensional NAND flash memory device, a stack structure is formed of a plurality of conductive layers and a plurality of interlayer insulating layers are alternately stacked one upon another on a semiconductor substrate, a vertical hole that passes through the stack structure is formed, and a charge trap layer and a channel layer are formed in the vertical hole. The charge trap layer is formed on a sidewall of the vertical hole, while the vertical hole having the charge trap layer therein is filled with the channel layer. The charge trap layer is a SiN layer capable of trapping electric charge. The above-described conventional three-dimensional NAND flash memory device has Silicon-Oxide-Nitride-Oxide-Silicon (SONOS) memory cells formed at intersections between channel layers and conductive layers. A SONOS memory cell has a deteriorated data retention characteristic and a lower erase speed in comparison with a floating-gate memory cell. Therefore, there is a need for a three-dimensional NAND flash memory device that has floating-gate memory cells with improved operating characteristics of a three-dimensional semiconductor device.

FIG. 1 is a cross-sectional view of a conventional floating gate type three-dimensional NAND flash memory device.

With reference to FIG. 1, the floating gate type three-dimensional NAND flash memory device includes a vertical channel layer 121; a tunnel insulating layer 119 formed on a sidewall of the vertical channel layer 121; a plurality of control gates CG stacked one upon another in a direction in which the vertical channel layer 121 extends and separated from each other with interlayer insulating layers 105a, 105b, 105c, 105d, and 105e interposed therebetween; floating gates FG formed between the plurality of control gates CG and covering the vertical channel layer 121 with the tunnel insulating layer 119 interposed therebetween; and a dielectric layer 115 formed between the floating gates FG and the control gates CG.

The plurality of control gates CG are formed by patterning a plurality of first conductive layers 107a, 107b, 107c, and 107d stacked one upon another and separated from each other with the interlayer insulating layers 105a, 105b, 105c, 105d, and 105e interposed therebetween, respectively. The first conductive layers 107a, 107b, 107c, and 107d may be silicon layers.

The dielectric layer 115 is formed along the surface of a vertical hole and the surface of a recessed region that extends from the vertical hole to the plurality of interlayer insulating layers 105a, 105b, 105c, 105d, and 105e. The vertical hole is formed by etching the plurality of first conductive layers 107a, 107b, 107c, and 107d and the plurality of interlayer insulating layers 105a, 105b, 105c, 105d, and 105e. The recessed region is formed by etching the plurality of interlayer insulating layers 105a, 105b, 105c, 105d, and 105e exposed through the vertical hole after the vertical hole is formed. When the recessed region is formed, sidewalls of the plurality of first conductive layers 107a, 107b, 107c, and 107d adjacent to the vertical hole protrude further than those of the plurality of interlayer insulating layers 105a, 105b, 105c, 105d, and 105e.

The floating gates FG are formed by filling the recessed regions with a second conductive layer 117 after the dielectric layer 115 is formed. The second conductive layer 117 may be a silicon layer.

The tunnel insulating layer 119 is formed on the sidewall of the vertical hole including sidewalls of the floating gates FG after the floating gates FG are formed. The tunnel insulating layer 119 has a thickness that allows electrons to pass by the tunnel effect when voltage having a predetermined level or higher is applied between the vertical channel layer 121 and the floating gates FG.

The vertical channel layer 121 may be formed by filling the vertical hole with a semiconductor material, such as silicon, after the tunnel insulating layer 119 is formed.

Memory cells are formed at intersections between the floating gates FG and the vertical channel layer 121. The memory cells are coupled in series in the direction in which the vertical channel layer 121 extends, thereby forming strings.

The above-described semiconductor device controls the voltage applied to the vertical channel layer 121 and the control gates CG to thereby accumulate charges on the floating gates FG. In order to write data in a selected floating gate FG_1, a program bias having a higher level than the voltage of the vertical channel layer 121 is applied to a pair of control gates CG_1 and CG_2 disposed over and under the selected floating gate FG_1. Electrons are thereby injected into the selected floating gate FG_1 to increase a threshold voltage of a selected memory cell.

During the above-described program operation, the program bias may cause undesirable injection of electrons into unselected floating gate FG_2 and FG_3 adjacent to the pair of control gates CG_1 and CG_2. In this case, a disturbance phenomenon occurs, that is, a threshold voltage of each of the unselected memory cells disposed over and under the selected memory cell changes.

Each of the memory cells of the conventional floating gate type three-dimensional NAND flash memory device is driven by two control gates CG stacked one upon another. Therefore, in order to form the memory cells constituting the strings, two more control gates CG than the number of floating gates FG need to be stacked. Further, because the two control gates used to drive a particular memory cell are shared by another memory cell disposed over or under the particular memory cell, operating conditions for driving the particular memory cell is complicated.

BRIEF SUMMARY

Example embodiments relate to a floating gate type three-dimensional semiconductor device including a floating-gate memory cell coupled to a single control gate and a method of manufacturing the same.

A semiconductor device according to an embodiment to the present invention includes a vertical channel layer protruding upward from a semiconductor substrate, a tunnel insulating layer covering a sidewall of the vertical channel layer, a plurality of floating gates separated from each other and stacked one upon another along the vertical channel layer, and surrounding the vertical channel layer with the tunnel insulating layer interposed therebetween, a plurality of control gates enclosing the plurality of floating gates, respectively, and an interlayer insulating layer provided between the plurality of control gates.

A method of manufacturing a semiconductor device according to an embodiment to the present invention includes stacking layer stacks alternating with third material layers, the layer stacks each having first material layers and a second material layer stacked between the first material layers, forming a vertical hole passing through the layer stacks and the third material layers stacked alternately with each other, forming a first recessed region by etching the second material layer exposed through the vertical hole, forming a floating gate which fills the first recessed region, forming a tunnel insulating layer along a sidewall of the vertical hole and a sidewall of the floating gate, and forming a vertical channel layer which fills the vertical hole.

DESCRIPTION OF EMBODIMENTS

Hereinafter, various embodiments of the present disclosure will be described in detail with reference to the accompanying drawings. The figures are provided to allow those having ordinary skill in the art to understand a scope of the embodiments of the disclosure.

A three-dimensional floating-gate NAND flash memory device and a method of manufacturing the same according to embodiments of the present invention that can reduce disturbance, reduce the size of a semiconductor device and simplify operating conditions of memory cells in comparison with the conventional floating gate type three-dimensional NAND flash memory device will now be described.

Figure 2:
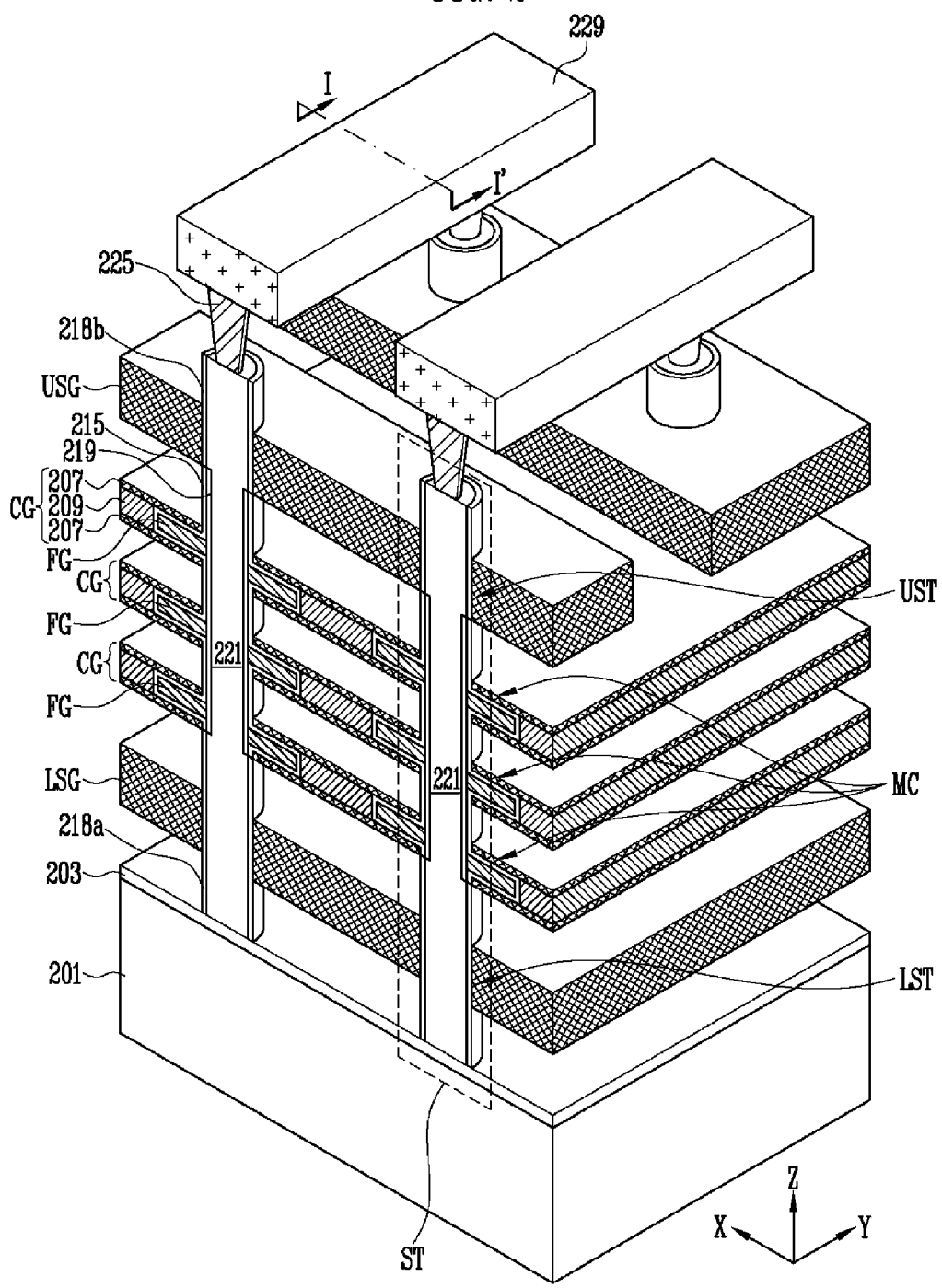
FIG. 2 is a perspective view of a semiconductor device according to an embodiment of the present invention.

FIG. 2 is a perspective view of a semiconductor device according to an embodiment of the present invention. FIG. 2 particularly illustrates a three-dimensional NAND flash memory device that has a lower select transistor, a plurality of memory cells, and an upper select transistor stacked one upon another in a sequential manner on a semiconductor substrate. In FIG. 2, interlayer insulating layers are not depicted.

Referring to FIG. 2, the semiconductor device according to an embodiment of the present invention includes a common source region 203, a plurality of bit lines 229, and a plurality of memory strings ST disposed between the common source region 203 and the bit lines 229.

The common source region 203 is a doped silicon layer that is formed on a semiconductor substrate 201 or an impurity-implanted region that is formed by implanting impurities into the semiconductor substrate 201. The plurality of memory strings ST that form memory blocks may be commonly coupled to an upper part of the common source region 203.

The bit lines 229 are conductive patterns that are separated from the semiconductor substrate 201 and are disposed above the semiconductor substrate 201. The bit lines 229 are arranged next to each other and separated from each other. For example, the bit lines 229 extend in the x-direction of an xyz coordinate system. The plurality of memory strings ST are coupled to each of the bit lines 229.

Each of the memory strings ST includes an upper select transistor UST, a lower select transistor LST and the plurality of memory cells MC that are coupled in series with each other along the vertical channel layer 221. The lower select transistor LST is coupled to the common source region 203, the upper select transistor UST is coupled to one of the bit lines 229, and the plurality of memory cells MC are disposed between the lower select transistor LST and the upper select transistor UST.

The vertical channel layer 221 extends in the z-direction perpendicular to the semiconductor substrate 201 and protrudes upward from the semiconductor substrate 201. The semiconductor device according to an embodiment of the present invention further includes a tunnel insulating layer 219 that is formed to cover at least a sidewall of the vertical channel layer 221. Preferably, the tunnel insulating layer 219 may have a thickness that allows electrons to pass by voltage having a predetermined level being applied to control gates CG of the memory cells MC.

A plurality of floating gates FG of the memory cells MC are separated from each other and stacked one upon another along the vertical channel layer 221. In addition, the floating gates FG are stacked in the z-direction along the vertical channel layer 221.

Figure 3:
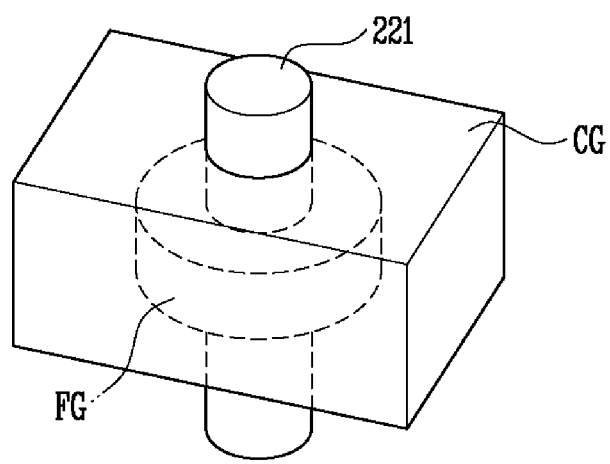
FIG. 3 is a schematic view of a portion of a memory cell of the semiconductor device of FIG. 2.

FIG. 3 is a schematic view of a portion of the memory cell of the semiconductor device shown in FIG. 2. FIG. 3 shows only the vertical channel layer 221, the floating gate FG and the control gate CG.

As shown in FIG. 3, the floating gate FG covers, encircles and/or surrounds the vertical channel layer 221. As shown in FIG. 2, the tunnel insulating layer 219 is formed between the floating gate FG and the vertical channel layer 221. The floating gate FG is surrounded, enveloped and/or enclosed by the control gate CG.

Referring to FIG. 2, the semiconductor device according to an embodiment of the present invention further includes a dielectric layer 215 that is formed between the floating gates FG and the control gates CG. The dielectric layer 215 may be further formed on the surfaces of the tunnel insulating layer 219 not surrounded by the control gate CG. Preferably, the dielectric layer 215 may have such a large thickness that the dielectric layer 215 can insulate the floating gates FG and the control gates CG of the memory cell MC from each other.

The control gates CG of the memory cells MC cover the top and bottom surfaces and sidewall of the floating gates FG, respectively, with the dielectric layer 215 interposed therebetween. In addition, the control gates CG are separated from each other and stacked one upon another in the z-direction along the vertical channel layer 221. The control gates CG each may be split by slits into memory block units and be in the form of plates. Each of the control gates CG includes a pair of first conductive layers 207 and a second conductive layer 209 interposed between the first conductive layers 207. Thus, each of the control gates CG may include first conductive layers 207 disposed over and under one of the floating gates FG while interposing the floating gate. Preferably, the second conductive layer 209 may have a greater thickness than the first conductive layer 207. The floating gate FG is formed in a recessed region of the second conductive layer 209 between the first conductive layers 207. The second conductive layer 209 may cover a sidewall of the floating gate FG between the first conductive layers 207. [As a result, as shown in FIG. 3, the floating gate FG is embedded in the control gate CG. Alternately, each of the control gates CG may be a single conductive layer that covers each of the floating gates FG.

The first and second conductive layers 207 and 209 may be formed of different materials having an etch selectivity therebetween so as to allow for a selective etch of any one of the first and second conductive layers 207 and 209. For example, the first conductive layer 207 may be a doped silicon layer, whereas the second conductive layer 209 may be an undoped silicon layer. Alternatively, the first conductive layer 207 may be an undoped silicon layer, while the second conductive layer 209 may be a doped silicon layer. The doped silicon layer may be a layer doped with impurities such as boron or carbon. The second conductive layer 209 may be a silicon layer, or a metal layer or a metal silicide layer having lower resistance than a silicon layer. When each of the control gates CG is formed of a single conductive layer, the conductive layer of each of the control gates CG may include a metal layer or a metal silicide layer having lower resistance than a silicon layer.

A first select gate LSG, which is a gate of the lower select transistor LST, is disposed between and separated from the plurality of control gates CG and the common source region 203. The first select gate LSG covers, encircles and/or surrounds the vertical channel layer 221 with a gate insulating layer 218a interposed therebetween. In addition, the first select gate LSG may have an etch selectivity with respect to the second conductive layer 209 such that the first select gate LSG cannot be removed during a selective etch process of the second conductive layer 209. Alternatively, the first select gate LSG may be formed of the same material as the first conductive layer 207. For example, the first select gate LSG may be formed of a doped silicon layer doped with impurities such as boron or carbon, an undoped silicon layer, a metal layer or a metal silicide layer. When each of the control gates CG is formed of a single conductive layer, the first select gate LSG may be formed of the same conductive material as the control gate CG. In addition, the first select gate LSG may be split into memory block units and be in the form of plates.

A second select gate USG, which is a gate of the upper select transistor UST, is separated from and disposed between the bit line 229 and the plurality of control gates CG stacked one upon another. The second select gate USG covers, encircles, and/or surrounds the vertical channel layer 221 with a gate insulating layer 218b interposed therebetween. In addition, the second select gate USG may have an etch selectivity with respect to the second conductive layer 209 such that the second conductive layer 209 is not removed during a selective etch process of the second conductive layer 209. Alternatively, the second select gate USG may be formed of the same material as the first conductive layer 207. For example, the second select gate USG may be formed of a doped silicon layer doped with impurities such as boron or carbon, an undoped silicon layer, a metal layer or a metal silicide layer. When each of the control gates CG is formed of a single conductive layer, the second select gate USG and the control gate CG may be formed of the same conductive material as each other. In addition, the second select gate USG may be in the form of a line that extends in a direction crossing the bit lines 229.

When the bit line 229 and the vertical channel layer 221 are separated from each other, a bit line contact plug 225 is further formed between the bit line 229 and the vertical channel layer 221 so as to establish a connection between the bit line 229 and the memory string ST. Though not shown in the drawings, the bit line 229 and the vertical channel layer 221 may come in direct contact with each other. In this case, the bit line contact plug 225 may be removed.

According to an embodiment of the present invention, each of the floating gates FG is covered by the dielectric layer 215 and embedded in each of the control gates CG. Therefore, the semiconductor device according to an embodiment of the present invention applies a program bias to a single control gates CG covering a selected floating gate FG in order to perform a program operation that injects electrons into the selected floating gate FG. Therefore, according to an embodiment of the present invention, program operation conditions can be simplified in comparison with the conventional floating gate type three-dimensional NAND flash memory device that injects electrons into a selected floating gate by a program bias being applied to two control gates.

According to an embodiment of the present invention, each of the floating gates FG is not formed between the neighboring control gates CG, but is instead embedded in each of the control gates CG, so that the distances between the plurality of control gates CG can be appropriately designed to reduce disturbance. Therefore, according to an embodiment of the present invention, a change in the threshold voltage of an unselected floating gate caused by a program bias applied to a selected control gate covering the selected floating gate can be avoided.

According to an embodiment of the present invention, each of the memory cells MC is driven by a single control gate CG. Therefore, in an embodiment of the present invention, the number of control gates CG stacked one upon another can be reduced as compared with the conventional floating gate type three-dimensional NAND flash memory device that includes memory cells each driven by two control gates. Accordingly, in an embodiment of the present invention, the size of the semiconductor device can be reduced.

Figure 1:
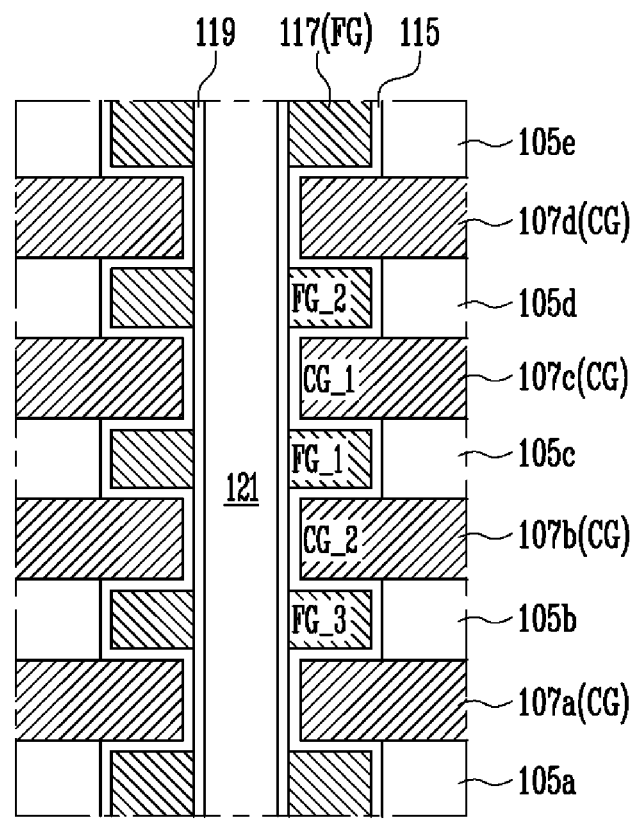
FIG. 1 is a cross-sectional view of a conventional floating gate type three-dimensional NAND flash memory device.

According to an embodiment of the present invention, the floating gate FG includes a top surface, a bottom surface and a sidewall that face the control gate CG. However, the sidewall of the conventional floating gate as shown in FIG. 1 does not face the control gate. Therefore, in an embodiment of the present invention, capacitance between the sidewall of the floating gate FG and the control gate CG can be better utilized as compared with that of the conventional floating gate type three-dimensional NAND flash memory device. That is, a coupling ratio between the control gate CG and the floating gate FG with respect to the floating gate FG of the same size is higher in an embodiment of the present invention than in the conventional floating gate type three-dimensional NAND flash memory device. In an embodiment of the present invention, the coupling ratio between the control gate CG and the floating gate FG can be increased, so that the size of the semiconductor device can be reduced by reducing the width of the floating gate FG. In addition, in the embodiment of the present invention, an operating voltage used to perform program and erase operations of memory cells can be reduced.

FIGS. 4A to 4H are cross-sectional views of the semiconductor device taken along line I-I' of FIG. 2 to illustrate a method of manufacturing the same according to a first embodiment.

Figure 4A:
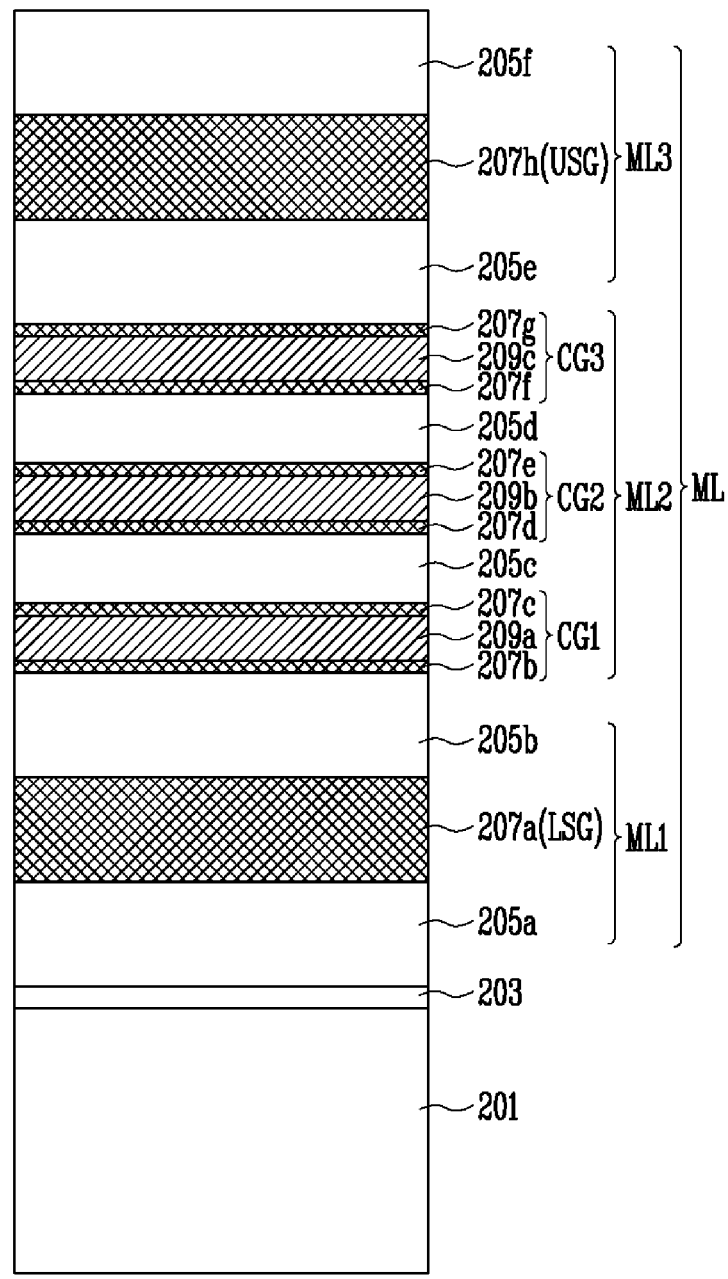
FIGS. 4A to 4H are cross-sectional views of the semiconductor device taken along line I-I' of FIG. 2 according to an embodiment of the present invention and illustrating a method of manufacturing the same according to a first embodiment of the present invention.

Referring to FIG. 4A, a stack structure ML is formed on the semiconductor substrate 201 including the common source region 203. The stack structure ML may include a first stack structure ML1, a second stack structure ML2 and a third stack structure ML3 that are stacked in a sequential manner.

The semiconductor substrate 201 may further include a well structure implanted with impurities. The common source region 203 may be formed by implanting impurities into the semiconductor substrate 201 or depositing a doped silicon layer onto the semiconductor substrate 201. N type impurities may be implanted into the common source region 203.

The first stack structure ML1 includes a first interlayer insulating layer 205a, the conductive layer 207a for the first select gate (LSG) and the second interlayer insulating layer 205b that are stacked one upon another on the semiconductor substrate 201 including the common source region 203. The first and second interlayer insulating layers 205a and 205b insulate the conductive layer 207a for the first select gate from the common source region 203 and the lowermost control gate conductive layer CG1.

The second stack structure ML2 has control gate conductive layers CG1, CG2, and CG3 and the third interlayer insulating layers 205c and 205d alternating with each other. The third interlayer insulating layers 205c and 205d insulate the control gate layers CG1, CG2, and CG3 from each other. The control gate conductive layer CG1, CG2 or CG3 is formed of a layer stack that has a pair of first material layers 207b and 207c, 207d and 207e or 207f and 207g and a second material layer 209a, 209b or 209c interposed therebetween. In this embodiment of the present invention, three control gate conductive layers CG1, CG2, and CG3 are stacked one upon another. However, the number of control gate conductive layers stacked one upon another may vary according to the number of memory cells. The first material layers 207b to 207g and the second material layers 209a to 209c may be formed of conductive layers having an etch selectivity therebetween. For example, the first material layers 207b to 207g may be formed of a doped silicon layer doped with impurities such as boron or carbon. The second material layers 209a to 209c may be formed of an undoped silicon layer. In other embodiments, the first material layers 207b to 207g may be formed of an undoped silicon layer, whereas the second material layers 209a to 209c may be formed of a doped silicon layer doped with impurities such as boron or carbon. The doped silicon layer and the undoped silicon layer may be crystalline or amorphous.

The third stack structure ML3 includes the fourth interlayer insulating layer 205e, the conductive layer 207h for the second select gate (USG), and the fifth interlayer insulating layer 205f that are stacked one upon another on the second stack structure ML2. The fourth and fifth interlayer insulating layers 205e and 205f insulate the conductive layer 207h from the uppermost control gate conductive layer CG3 and the bit line 229 to be formed in a subsequent process.

Preferably, the first to fifth interlayer insulating layers 205a to 205f may be formed of third material layers that have insulation properties and an etch selectivity with respect to the first and second material layers 207b to 207g and 209a to 209c. For example, the first to fifth interlayer insulating layers 205a to 205f each may be formed of a silicon oxide layer. Preferably, the conductive layers 207a and 207h for the first and second select gates may have an etch selectivity with respect to the second material layers 209b and 209c such that the conductive layers 207a and 207h for the first and second select gates are hardly removed during a subsequent etch process that selectively etches the second material layers 209a to 209c, or the conductive layers 207a and 207h may be formed of the same layer as the first material layers 207b to 207g. For example, the conductive layers 207a and 207h for the first and second select gates each may be formed of a doped silicon layer doped with impurities such as boron or carbon, an undoped silicon layer, a metal silicide layer or a metal layer. The doped silicon layer and the undoped silicon layer may be crystalline or amorphous. The metal silicide layer and the metal layer have lower resistance than the doped silicon layer and the undoped silicon layer.

The first stack structure ML1 and the second stack structure ML2 may be stacked in the form of plates on a memory cell region. In addition, the stack structure ML is patterned such that the conductive layer 207a for the first select gate of the first stack structure ML1, the control gate conductive layers CG1, CG2, and CG3 of the second stack structure ML2, and the conductive layer 207h of the third stack structure ML3 may gradually protrude downward to form a stepped structure. In order to cause the stack structure ML to have the stepped structure, the stack structure ML may be repeatedly etched by using a photoresist pattern as a mask while the size of the photoresist pattern is being decreased, and the photoresist pattern is subsequently removed. In addition, a process of patterning the third stack structure ML3 in the form of lines may be additionally performed.

Figure 4B:
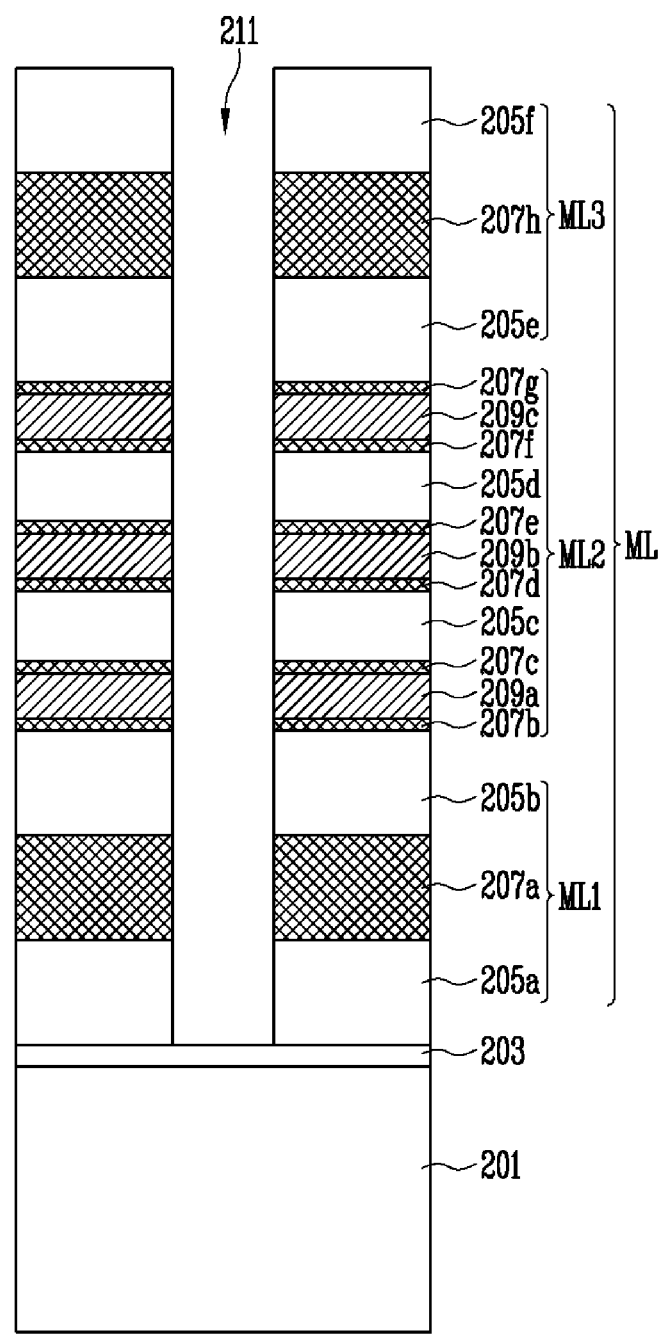

Referring to FIG. 4B, a portion of the stack structure ML is removed to form a plurality of vertical holes 211 that pass through the stack structure ML. In FIG. 4B, one of the vertical holes 211 is shown for illustration purposes. The vertical holes 211 expose the common source region 203.

After a first hard mask pattern (not shown) that exposes a region in which the vertical hole 211 will be formed is placed over the stack structure ML to form the vertical hole 211, the first to fifth interlayer insulating layers 205a to 205f, the conductive layer 207a for the first select gate (LSG), the conductive layer 207h for the second select gate (USG), and the first and second material layers 207b to 207g and 209a to 209c exposed by the first hard mask pattern are etched by using an anisotropic etch process. The plurality of vertical holes 211 may be arranged in a matrix in the xy plane. The first hard mask pattern may be removed after the vertical holes 211 are formed.

Figure 4C:
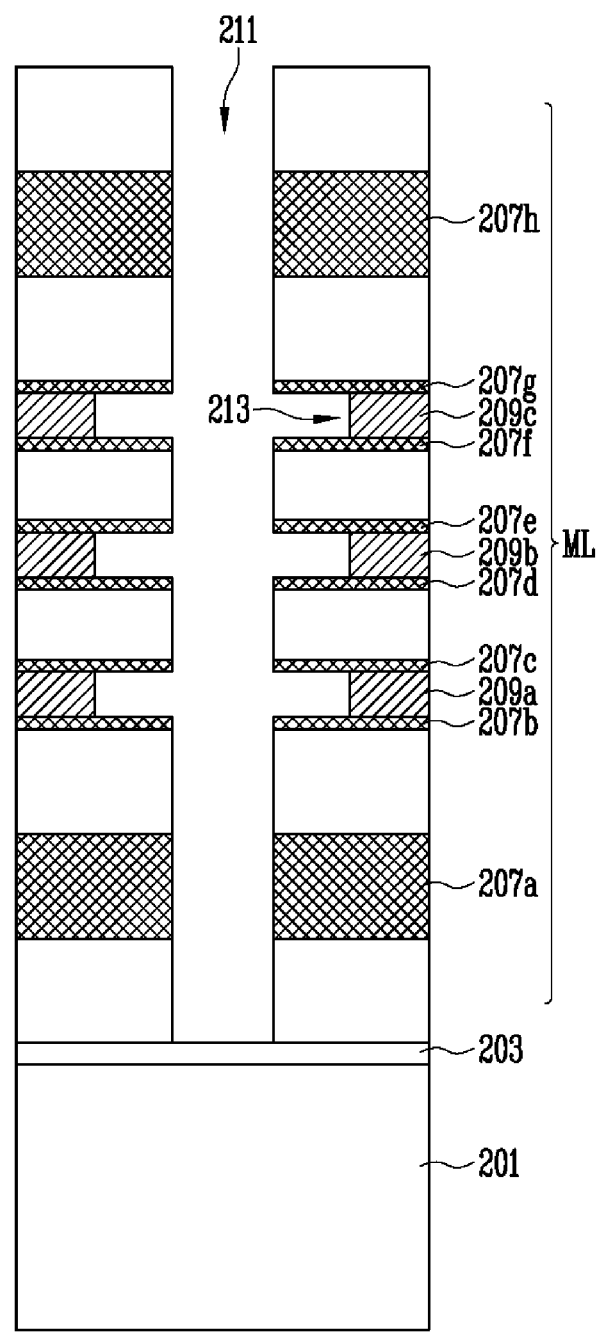

Referring to FIG. 4C, parts of the second material layers 209a to 209c exposed through the vertical hole 211 are removed by using an etching material for selective removal of the second material layers 209a to 209c to thereby form a recessed region 213.

The etching material used to selectively remove the second material layers 209a to 209c may hardly etch the first material layers 207b to 207g and the conductive layers 207a and 207h for the first and second select gates, and the etching material used to selectively remove the second material layers 209a to 209c may be able to quickly etch the second material layers 209a to 209c. The etching material used to selectively remove the second material layers 209a to 209c may vary depending on the second material layers 209a to 209c, the first material layers 207b to 207g, and the conductive layers 207a and 207h for the first and second select gates. In addition, the process of selectively etching the second material layers 209a to 209c includes a dry etch process, a wet etch process or a remote plasma etch process.

Figure 4D:
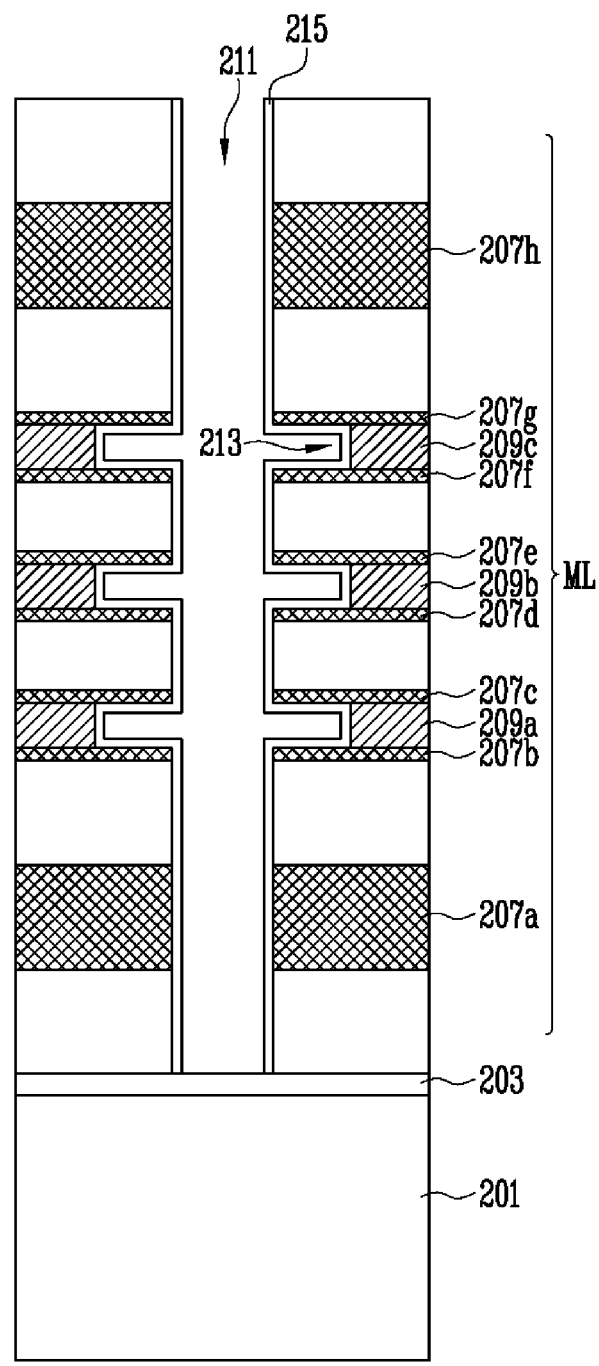

Referring to FIG. 4D, the dielectric layer 215 is formed along the surface of the recessed region 213 and the sidewall of the vertical hole 211. The dielectric layer 215 may comprise an oxide layer, a nitride layer and an oxide layer stacked one upon another and dielectric layer 215 may be formed of a material including a high dielectric film having a higher dielectric constant than an oxide layer and a nitride layer.

The dielectric layer 215 is deposited onto the surface of the entire structure including the recessed region 213. Subsequently, an etch process such as an etch-back process is performed to remove the dielectric layer 215 from the bottom surface of the vertical hole 211 and the top surface of the stack structure ML so that the dielectric layer 215 may remain on only the surface of the recessed region 213 and the inner wall surface of the vertical hole 211. The common source region 203 is exposed through the dielectric layer 215 that remains after the etch process.

Figure 4E:
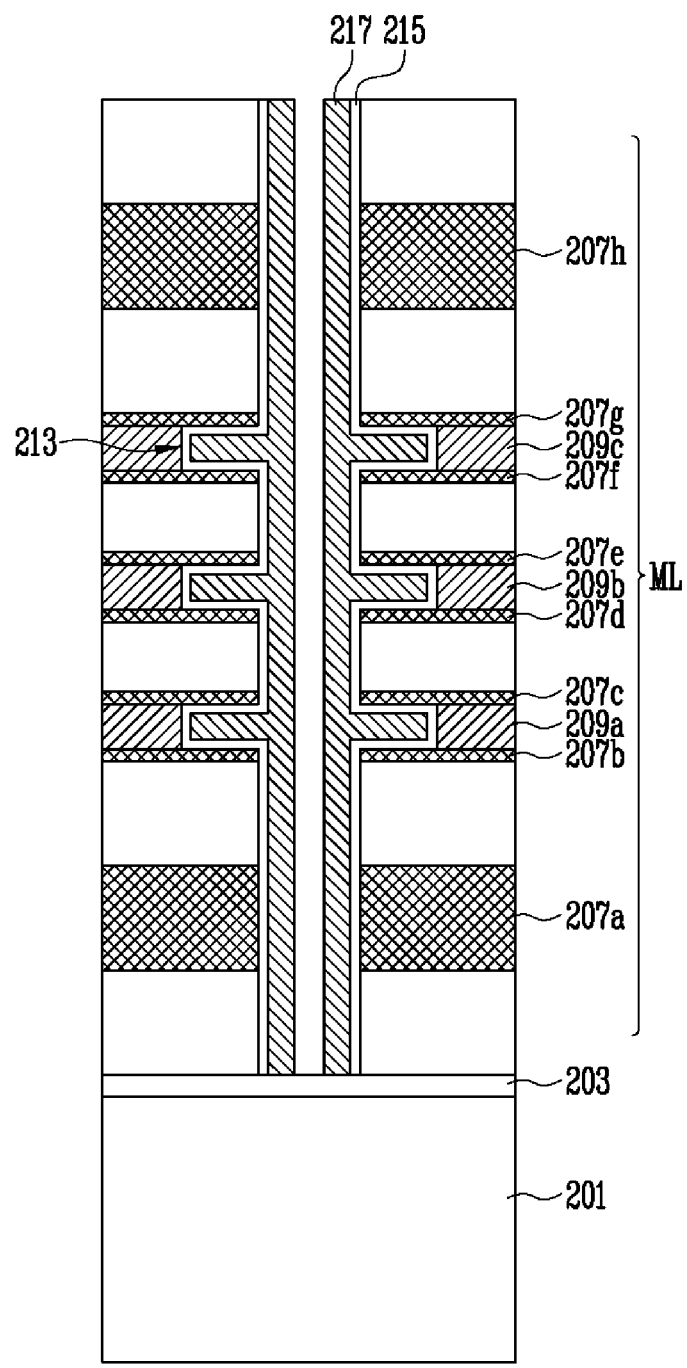

Referring to FIG. 4E, a floating gate conductive layer 217 is formed along the surface of the entire structure including the dielectric layer 215 exposing the common source region 203 to thereby fill the recessed region 213. The floating gate conductive layer 217 may be formed of a silicon layer.

Figure 4F:
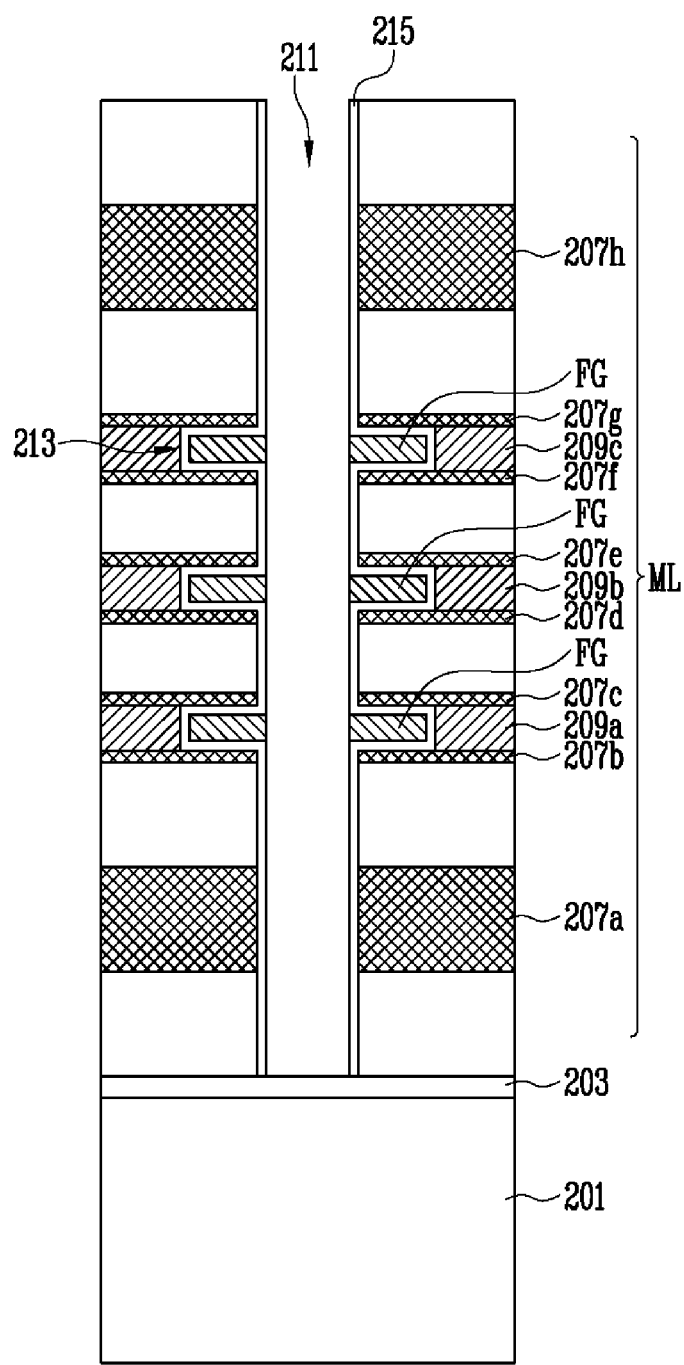

Referring to FIG. 4F, a portion of the floating gate conductive layer 217 is removed from the top surface of the stack structure ML and the bottom surface and the sidewall of the vertical hole 211 by using a wet or dry etch process. At this point, the floating gate conductive layer 217 is left as the floating gates FG within the recessed region 213.

Figure 4G:
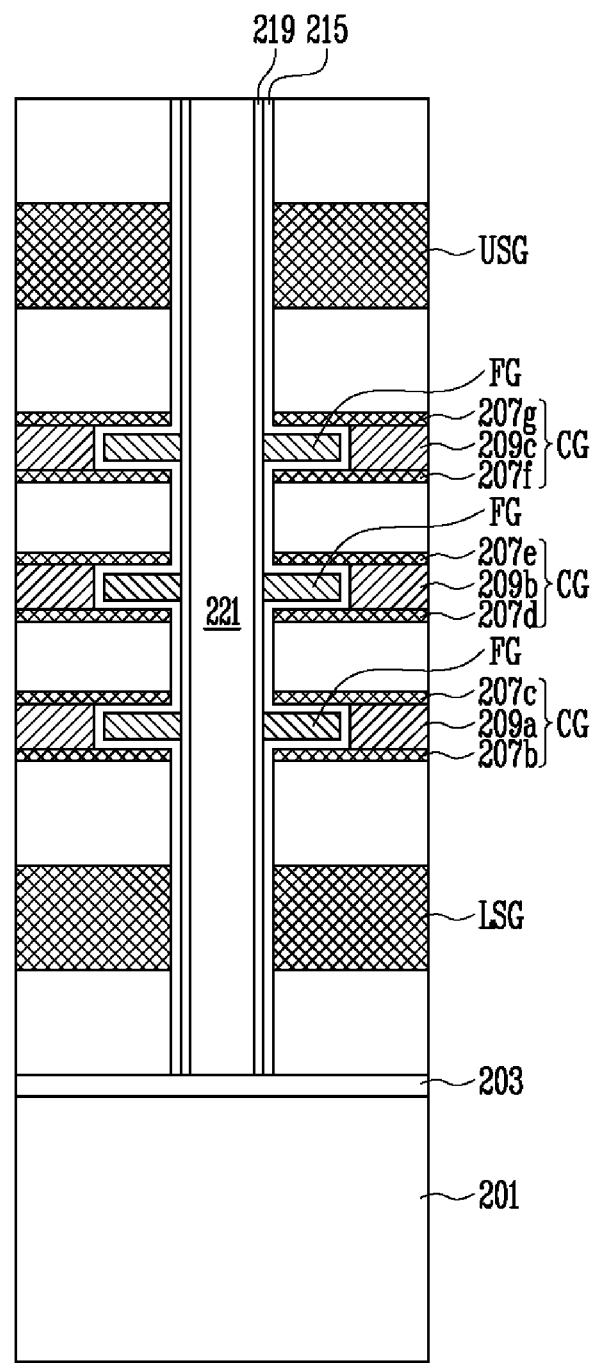

Referring to FIG. 4G, a tunnel insulating layer 219 is formed along the sidewalls of the floating gates FG and the surface of the dielectric layer 215, as well as, along a sidewall of the vertical hole 211. The tunnel insulating layer 219 may be formed of a silicon oxide layer. The dielectric layer 215 and the tunnel insulating layer 219 formed on the sidewalls of the first and second select gates LSG and USG each become a gate insulating layer.

Subsequently, the vertical hole 211 is filled with the vertical channel layer 221. The vertical channel layer 221 is a semiconductor layer and may be formed of silicon. The vertical channel layer 221 is coupled to the common source region 203.

Though not shown in FIG. 4G, before the second stack structure ML2, the recessed region 213, the dielectric layer 215, the floating gates FG, and the tunnel insulating layer 219 are formed, an operation of forming a first vertical hole passing through the first stack structure ML1, an operation of forming a gate insulating layer on a sidewall of the first vertical hole and an operation of filling the first vertical hole with a channel layer may be performed in a sequential manner. In addition, the third stack structure ML3 may be formed after an operation of forming a second vertical hole passing through the second stack structure ML2, an operation of forming the recessed region 213, an operation of forming the dielectric layer 215, an operation of forming the floating gate FG, an operation of forming the tunnel insulating layer 219 and an operation of forming a channel layer with which the second vertical hole is filled may be performed in a sequential manner. After the third stack structure ML3 is formed, an operation of forming a third vertical hole passing through the third stack structure ML3, an operation of forming a gate insulating layer on a sidewall of the third vertical hole and an operation of filling the third vertical hole with a channel layer are performed in a sequential manner.

Figure 4H:
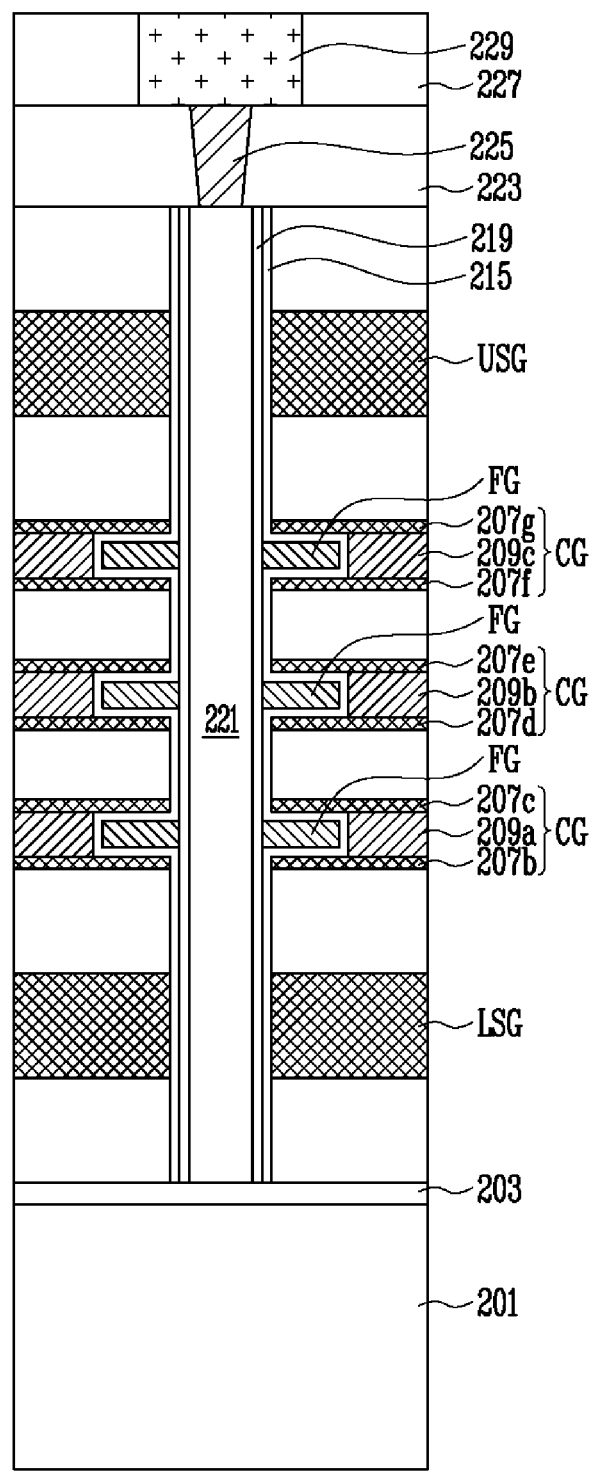

Referring to FIG. 4H, after a sixth interlayer insulating layer 223 is formed over the entire structure having the vertical channel layer 221 thereon, a bit line contact plug 225 is formed. The bit line contact plug 225 may pass through the sixth interlayer insulating layer 223 and the bit line contact plug 225 may be coupled to the vertical channel layer 221. The sixth interlayer insulating layer 223 is formed of an insulating material such as a silicon oxide layer. The bit line contact plug 225 may be formed of a doped silicon layer, a metal layer or a metal silicide layer.

Subsequently, after a seventh interlayer insulating layer 227 is formed over the entire structure including the bit line contact plug 225, the bit line 229 is formed. The bit line 229 may pass through the seventh interlayer insulating layer 227 and the bit line 229 may be coupled to the bit line contact plug 225. The seventh interlayer insulating layer 227 is formed of an insulating material such as a silicon oxide layer, and the bit line 229 is formed of a conductive material.

FIGS. 5A to 5H are cross-sectional views illustrating a method of manufacturing a semiconductor device according to a second embodiment of the present invention.

Figure 5A:
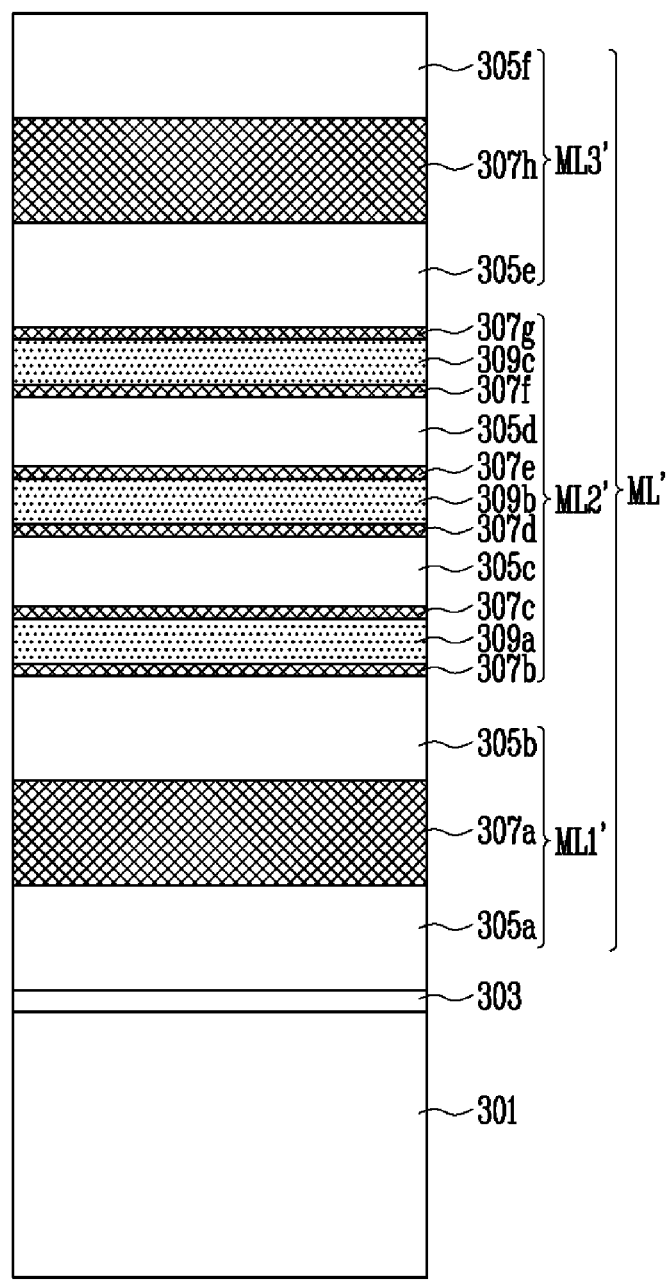
FIGS. 5A to 5H are cross-sectional views illustrating a method of manufacturing a semiconductor device according to a second embodiment of the present invention.

Referring to FIG. 5A, a stack structure ML' that has first material layers 307a to 307h, second material layers 309a to 309c, and third material layers 305a to 305f stacked one upon another is formed on a semiconductor substrate 301 that includes a common source region 303. The first material layers 307a to 307h are used as conductive layers for a first select gate (LSG shown in FIG. 5G), control gates and a second select gate (USG shown in FIG. 5G), the second material layers 309a to 309c are used as sacrificial layers, and the third material layers 305a to 305f are used as interlayer insulating layers. Preferably, the first to third material layers 307a to 307h, 309a to 309c and 305a to 305f may be formed of layers having an etch selectivity with respect to each other. The stack structure ML' includes a first stack structure ML1', a second stack structure ML2' and a third stack structure ML3' that are stacked one upon another in a sequential manner.

The semiconductor substrate 301 may further include a well structure into which impurities are implanted. The common source region 303 may be formed by implanting impurities into the semiconductor substrate 301 or depositing a doped silicon layer onto the semiconductor substrate 301. N type impurities may be implanted into the common source region 303.

The first stack structure ML1' includes the third material layer 305a for a first interlayer insulating layer, the first material layer 307a for the first select gate (LSG) and the third material layer 305b for the second interlayer insulating layer that are stacked one upon another on the semiconductor substrate 301 including the common source region 303. The third material layers 305a and 305b for first and second interlayer insulating layers insulate the first material layer 307a for the first select gate (LSG) from the common source region 303 and the first material layer 307b for a control gate (CG shown in FIG. 5G).

The second stack structure ML2' has layer stacks each having the first material layer 307b, 307d or 307f, the second material layer 309a, 309b or 309c and the first material layer 307c, 307e or 307g, and the third material layers 305c and 305d for third interlayer insulating layers that alternate with each other on the first stack structure ML1'. The number of layer stacks and the number of the third material layer for third interlayer insulating layer may vary according to the number of memory cells to be stacked one upon another. The first material layers 307b to 307g each may be a conductive layer that is used as a portion of each of the control gate conductive layers. The first material layers 307b to 307g each may be a doped silicon layer doped with impurities such as boron or carbon, an undoped silicon layer, a metal layer or a metal silicide layer. The doped silicon layer and the undoped silicon layer may be crystalline or amorphous. The metal silicide layer and the metal layer have lower resistance than the doped silicon layer and the undoped silicon layer. The second material layers 309a to 309c may be sacrificial layers that are formed of different materials from the interlayer insulating layers 305a to 305f such that the second material layers 309a to 309c have an etch selectivity with respect to the third material layers 305a to 305f for the interlayer insulating layers. For example, the second material layers 309a to 309c each may be formed of a nitride layer.

The third stack structure ML3' includes the third material layer 305e for the fourth interlayer insulating layer, the first material layer 307h for the second select gate (USG), and the third material layer 305f for the fifth interlayer insulating layer that are stacked one upon another on the first stack structure ML2'. The third material layers 305e and 305f for the fourth and fifth interlayer insulating layers insulate the first material layer 307h for the second select gate (USG) from the first material layer 307g for the control gate (CG) and a bit line 329.

The third material layers 305a to 305f each may be formed of a silicon oxide layer. The first material layers 307a to 307h each may be formed of a doped silicon layer doped with impurities such as boron or carbon, an undoped silicon layer, a metal silicide layer or a metal layer. The doped silicon layer and the undoped silicon layer may be crystalline or amorphous. The metal silicide layer and the metal layer have lower resistance than the doped silicon layer and the undoped silicon layer.

Figure 5B:
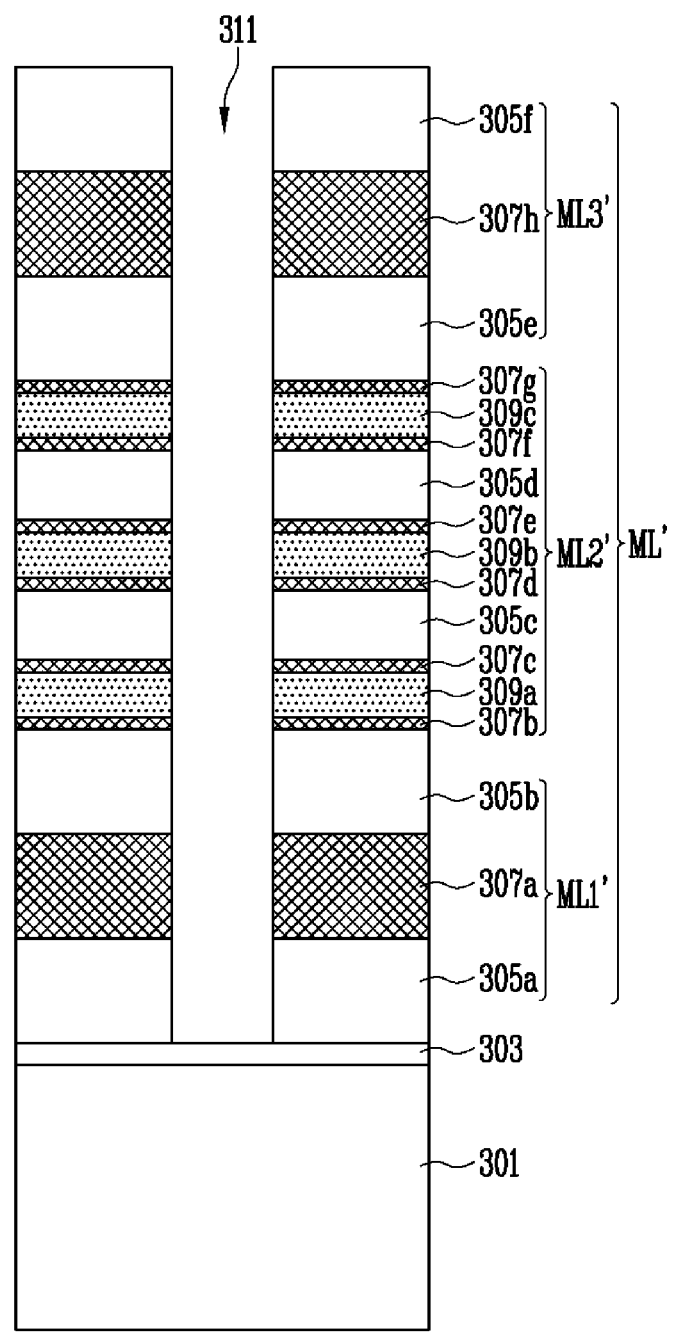

Referring to FIG. 5B, a portion of the stack structure ML' is removed to form a plurality of vertical holes 311 that pass through the stack structure ML'. In FIG. 5B, one of the vertical holes 311 is shown for illustration purposes. The vertical holes 311 expose the common source region 303.

A process of forming the vertical holes 311 is substantially the same as the process described above in connection with FIG. 4B.

Figure 5C:
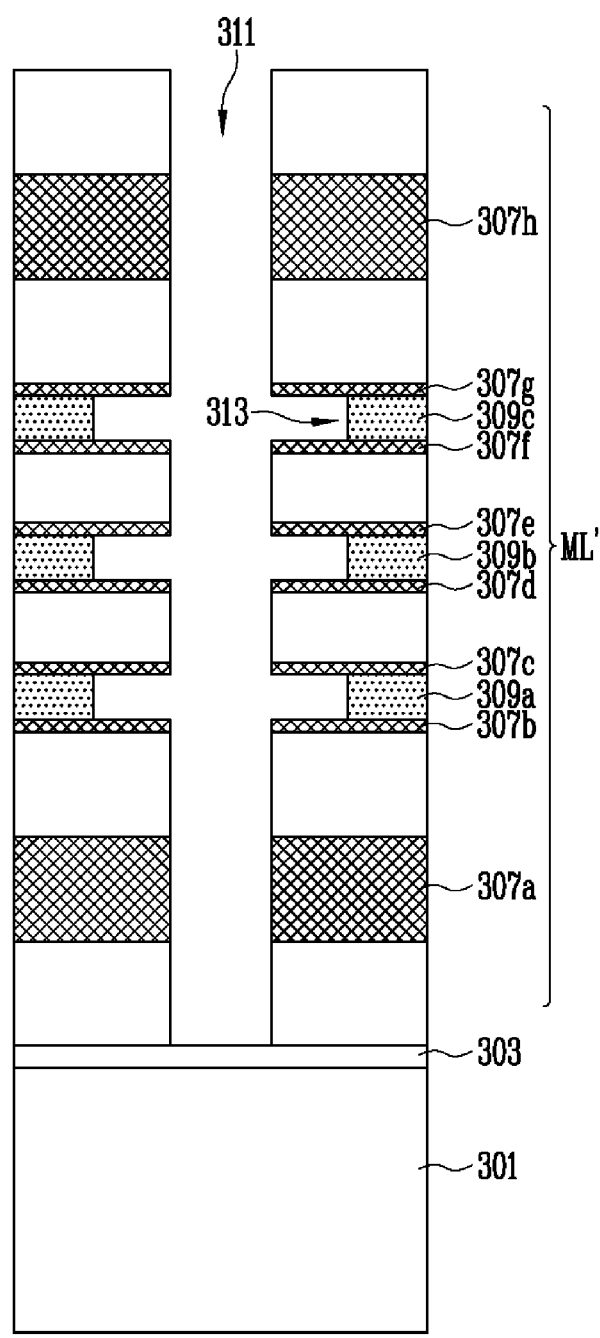

Referring to FIG. 5C, parts of the second material layers 309a to 309c exposed through the vertical hole 311 are removed by using an etching material for selective removal of the second material layers 309a to 309c, which are sacrificial layers, to thereby form a first recessed region 313.

Figure 5D:
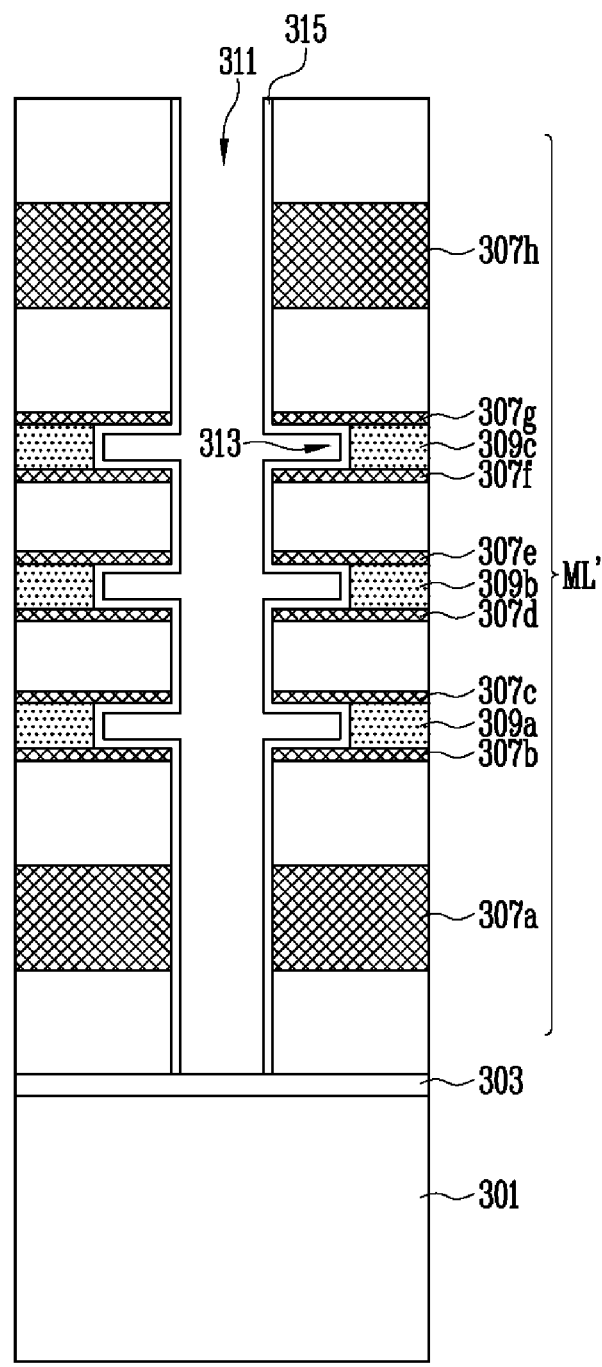

Referring to FIG. 5D, a dielectric layer 315 is formed on the surface of the first recessed region 313 and the sidewall of the vertical hole 311. The dielectric layer 315 may comprise an oxide layer, a nitride layer and an oxide layer stacked one upon another and be formed of a material including a high dielectric layer having a higher dielectric constant than an oxide layer and a nitride layer.

A detailed process of forming the dielectric layer 315 is substantially the same as the process described above in connection with FIG. 4D.

Figure 5E:
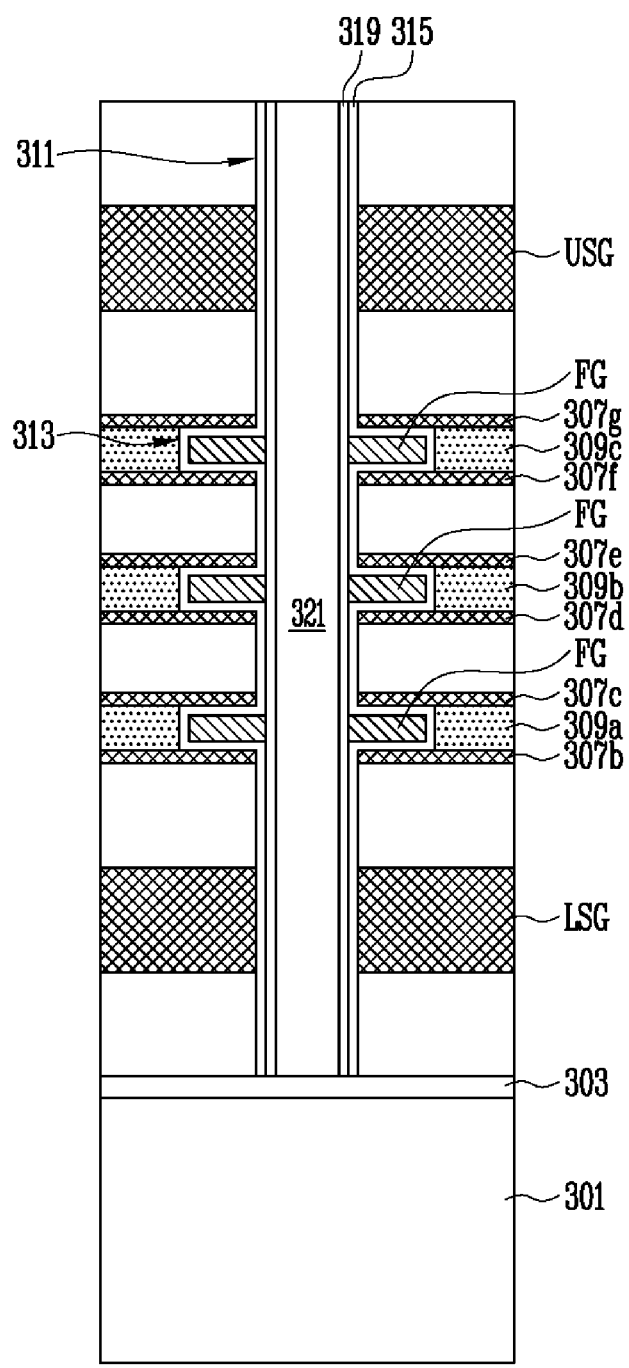

Referring to FIG. 5E, the floating gates FG are formed in the first recessed region 313 in substantially the same manner as described above in connection with FIGS. 4 to 4F.

Subsequently, after a tunnel insulating layer 319 is formed on the sidewalls of the floating gates FG and the surface of the dielectric layer 315, the vertical hole 311 is filled with a vertical channel layer 321 as described above in connection with FIG. 4G. A trench is formed to expose the second material layers 309a to 309c of the stack structure ML'. The trench may pass through the stack structure ML' between the vertical channel layers 321 adjacent to each other.

Figure 5F:
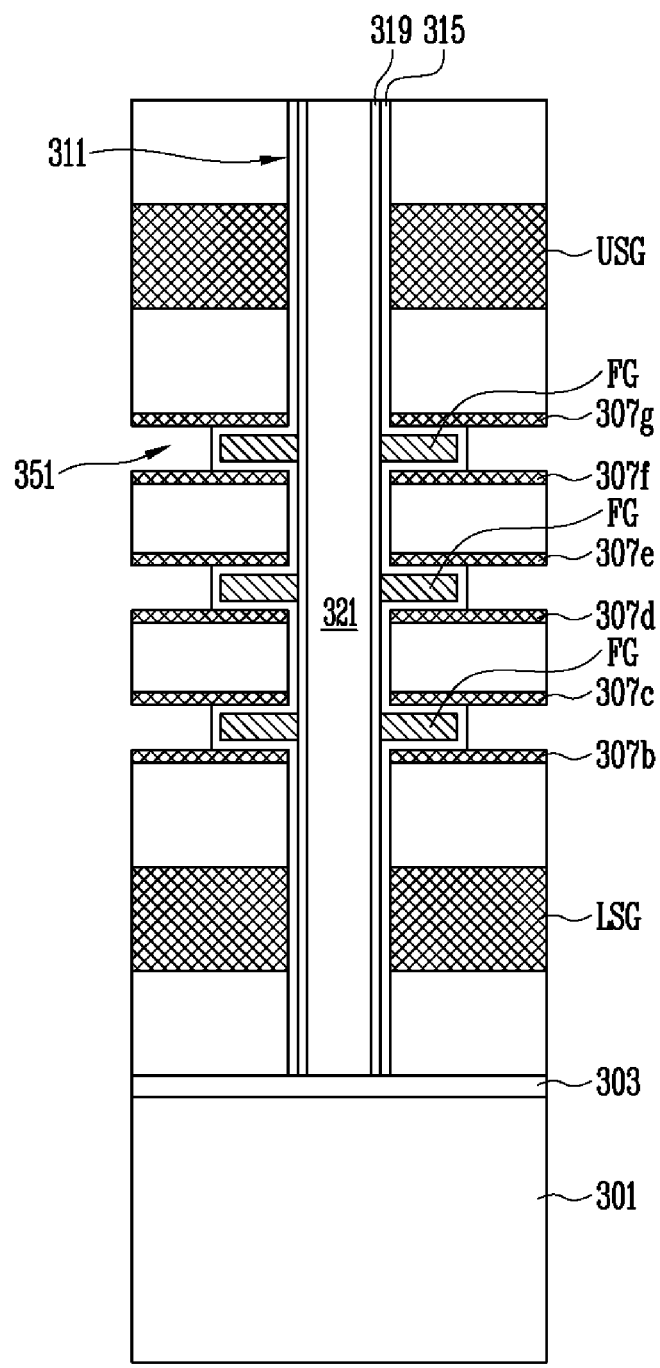

Referring to FIG. 5F, the second material layers 309a to 309c exposed through the trench are removed. In this manner, a second recessed region 351 is formed in a region from which the second material layers 309a to 309c are removed. The second recessed regions 351 are formed between the first material layers 307b to 307g which are first conductive layers for control gates.

Figure 5G:
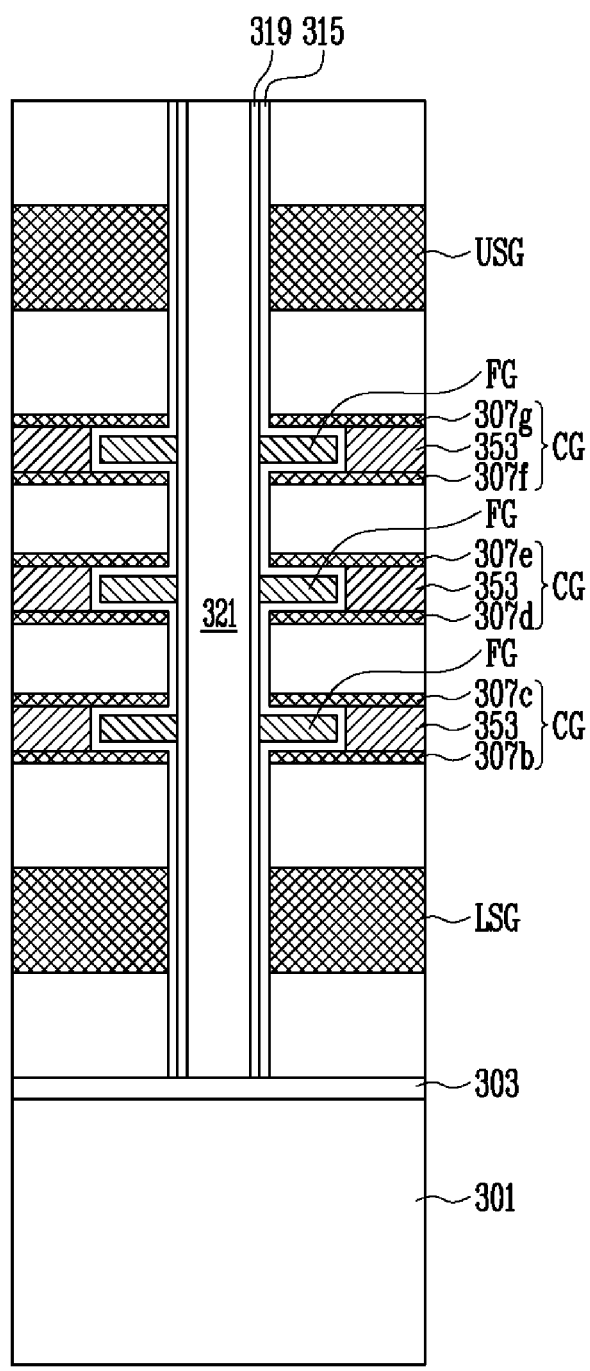

Referring to FIG. 5G, the second recessed region 351 is filled with a conductive layer 353 for a control gate. In this manner, outside walls of the floating gates FG formed between the first material layers 307b to 307g for control gates adjacent to each other are surrounded by the conductive layer 353 for control gates. As a result, the floating gates FG are embedded in the control gates CG, respectively.

The conductive layer 353 each may be formed of a doped silicon layer doped with impurities such as boron or carbon, an undoped silicon layer, a metal silicide layer or a metal layer. The doped silicon layer and the undoped silicon layer may be crystalline or amorphous. The metal silicide layer and the metal layer have lower resistance than the doped silicon layer and the undoped silicon layer.

Figure 5H:
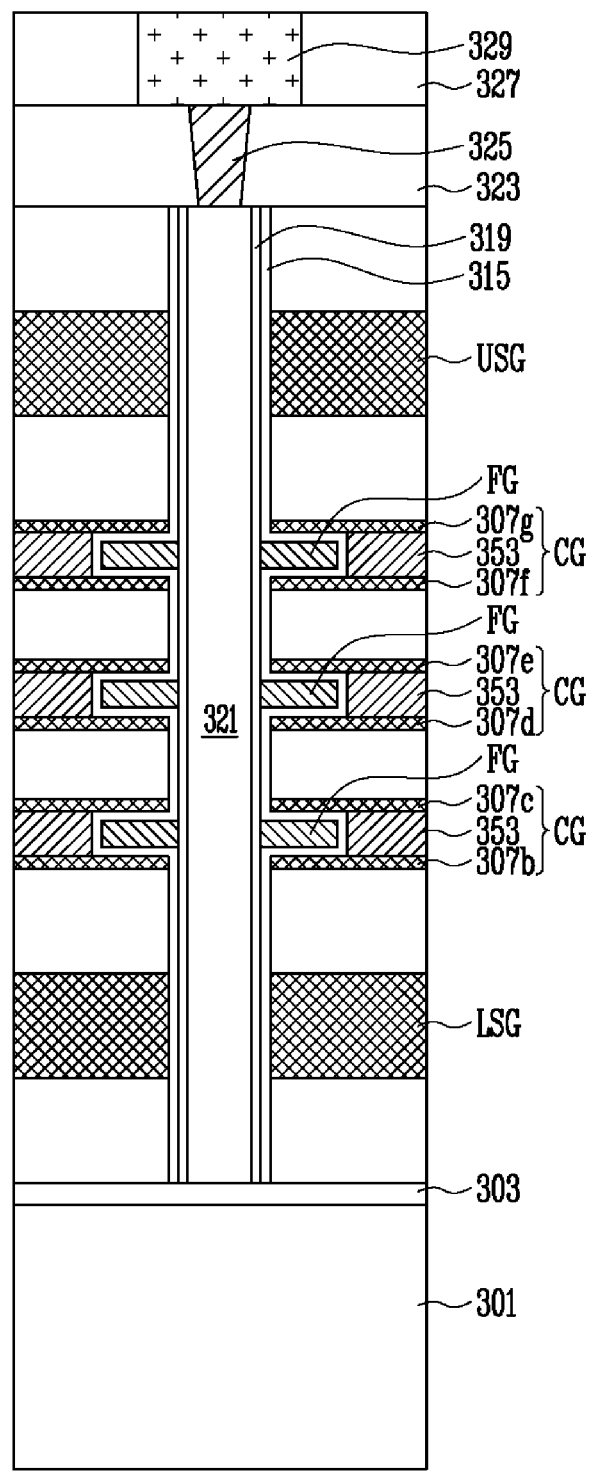

Referring to FIG. 5H, after a sixth interlayer insulating layer 323 is formed over the entire structure having the vertical channel layer 321 thereon, a bit line contact plug 325 is formed. The bit line contact plug 325 may pass through the sixth interlayer insulating layer 323 and may be coupled to the vertical channel layer 321. The sixth interlayer insulating layer 323 is formed of an insulating material such as a silicon oxide layer. The bit line contact plug 325 may be formed of a doped silicon layer, a metal layer or a metal silicide layer.

Subsequently, after a seventh interlayer insulating layer 327 is formed over the entire structure having the bit line contact plug 325 therein, the bit line 329 is formed. The bit line 329 may pass through the seventh interlayer insulating layer 327 and may be coupled to the bit line contact plug 325. The seventh interlayer insulating layer 327 is formed of an insulating material such as a silicon oxide layer, while the bit line 329 is formed of a conductive material.

FIGS. 6A to 6D are cross-sectional views illustrating a method of manufacturing a semiconductor device according to a third embodiment of the present invention.

Figure 6A:
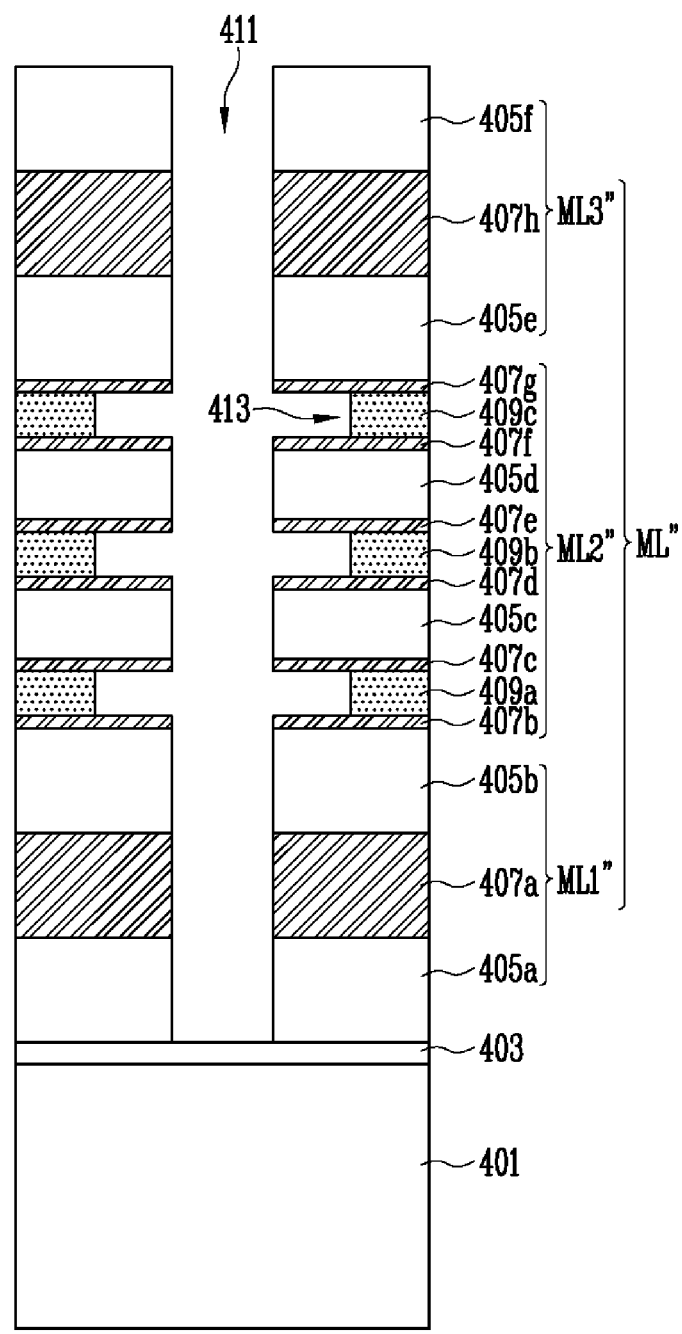
FIGS. 6A to 6D are cross-sectional views illustrating a method of manufacturing a semiconductor device according to a third embodiment of the present invention.

Referring to FIG. 6A, a stack structure ML" that has first material layers 407a to 407h, which are used as first sacrificial layers, second material layers 409a to 409c, which are used as second sacrificial layers, and third material layers 405a to 405f, which are used as interlayer insulating layers, stacked one upon another is formed on a semiconductor substrate 401 that includes a common source region 403. Preferably, the first to third material layers 407a to 407h, 409a to 409c and 405a to 405f may be formed of different materials so as to have an etch selectivity therebetween. The stack structure ML" includes a first stack structure ML1", a second stack ML2" and a third stack structure ML3" that are stacked one upon another in a sequential manner.

The semiconductor substrate 401 may further include a well structure into which impurities are implanted. The common source region 403 may be formed by implanting impurities into the semiconductor substrate 401 or depositing a doped silicon layer onto the semiconductor substrate 401. N type impurities may be implanted into the common source region 403.

The first stack structure ML1" includes the third material layer 405a for the first interlayer insulating layer, the first material layer 407a for the first sacrificial layer defining a region in which a first select gate is formed, and the third material layer 405b for second interlayer insulating layer that are stacked one upon another on the semiconductor substrate 401 including the common source region 403. The third material layers 405a and 405b for the first and second interlayer insulating layers insulate the first select gate (LSG shown in FIG. 6D) from the common source region 403 and the control gate (CG shown in FIG. 6D).

The second stack ML2" has layer stacks each having the first material layer 407b, 407d or 407f, the second material layer 409a, 409b or 409c and the first material layer 407c, 407e or 407g, and the third material layers 405c and 405d for third interlayer insulating layers that alternate with each other on the first stack structure ML1". The number of layer stacks and the number of the third material layers for third interlayer insulating layers vary according to the number of memory cells to be stacked one upon another. The third material layers 405c and 405d for the third interlayer insulating layers is formed to insulate the control gates.

The third stack structure ML3" includes the third material layer 405e, the first material layer 407h, and the third material layer 405f that are stacked on the second stack ML2". The third material layer 405e may comprise the fourth interlayer insulating layer. The first material layer 407h may comprise the first sacrificial layer defining a region in which the second select gate is formed. The third material layer 405f may comprise the fifth interlayer insulating layer. The third material layers 405e and 405f for the fourth and fifth interlayer insulating layers insulate the second select gate (USG shown in FIG. 6D) from the control gate (CG shown in FIG. 6D) and a bit line 429.

Preferably, the second material layers 409a to 409c may be formed of materials having an etch selectivity with respect to the first material layers 407a to 407h. For example, the first material layers 407a to 407h may be formed of a doped nitride layer doped with impurities such as boron or carbon, and the second material layers 409a to 409c may be formed of an undoped nitride layer. In contrast, the first material layers 407a to 407h may be formed of an undoped nitride layer, while the second material layers 409a to 409c may be formed of a doped nitride layer doped with impurities such as boron or carbon. That is, the first material layers 407a to 407h and the second material layers 409a to 409c may be formed of nitride layers having different compositions from each other.

The third material layers 405a to 405f may be formed of a silicon oxide layer.

Subsequently, a portion of the stack structure ML" is removed to form a plurality of vertical holes 411 that pass through the stack structure ML" and expose the common source region 403. A process of forming the vertical holes 411 is substantially the same as the process described in detail above with reference to FIG. 4B.

Subsequently, parts of the second material layers 409a to 409c exposed through the vertical holes 411 are removed by using an etching material for selective removal of the second material layers 409a to 409c to thereby form a first recessed region 413.

Figure 6B:
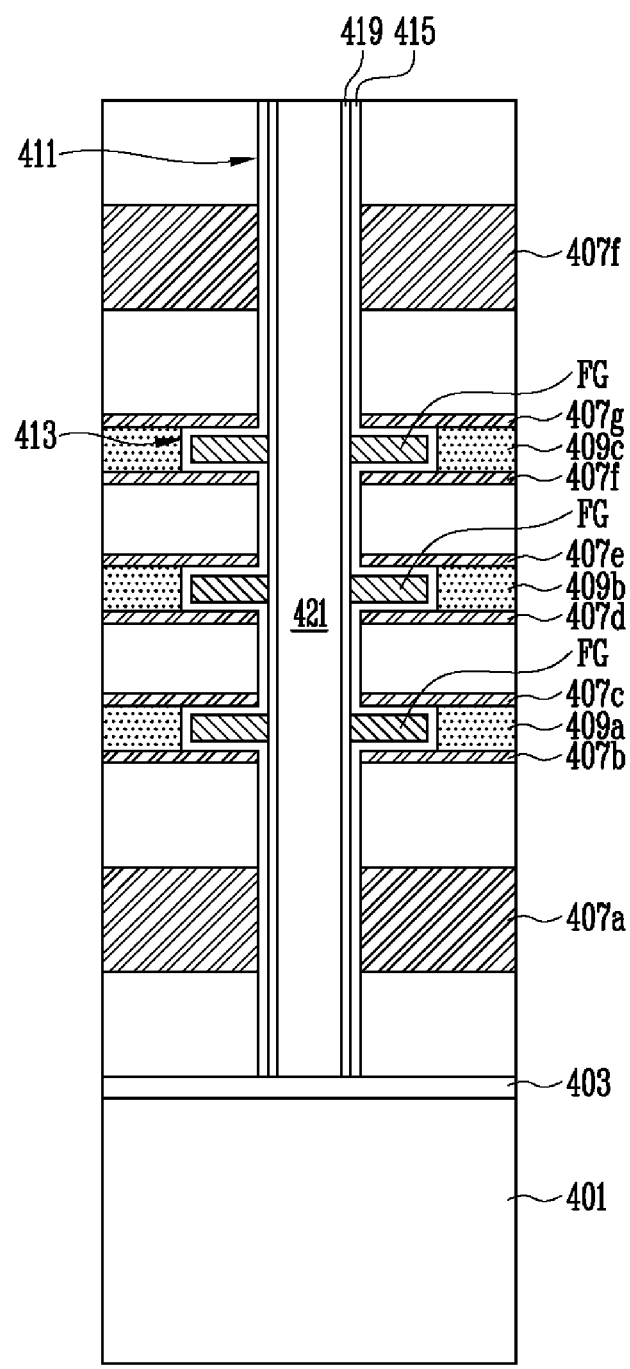

Referring to FIG. 6B, a dielectric layer 415 is formed on the surface of the first recessed region 413 and the sidewall of the vertical hole 411. The dielectric layer 415 may comprise an oxide layer, a nitride layer and an oxide layer stacked one upon another and the dielectric layer 415 may be formed of a material including a high dielectric layer having a higher dielectric constant than an oxide layer and a nitride layer.

The detailed process of forming the dielectric layer 415 is substantially the same as the process described in detail with above reference to FIG. 4D.

Subsequently, the floating gates FG are formed in the first recessed region 413 in the same manner described above in connection with FIGS. 4E to 4F. In a substantially same manner as described above in connection with FIG. 4G, after a tunnel insulating layer 419 is formed on the sidewalls of the floating gates FG and the surface of the dielectric layer 415, the vertical hole 411 is filled with a vertical channel layer 421.

Subsequently, a trench is formed to expose the first material layers 407a to 407f and the second material layers 409a to 409c of the stack structure ML". The trench may pass through the stack structure ML" between the vertical channel layers 421 adjacent to each other.

Figure 6C:
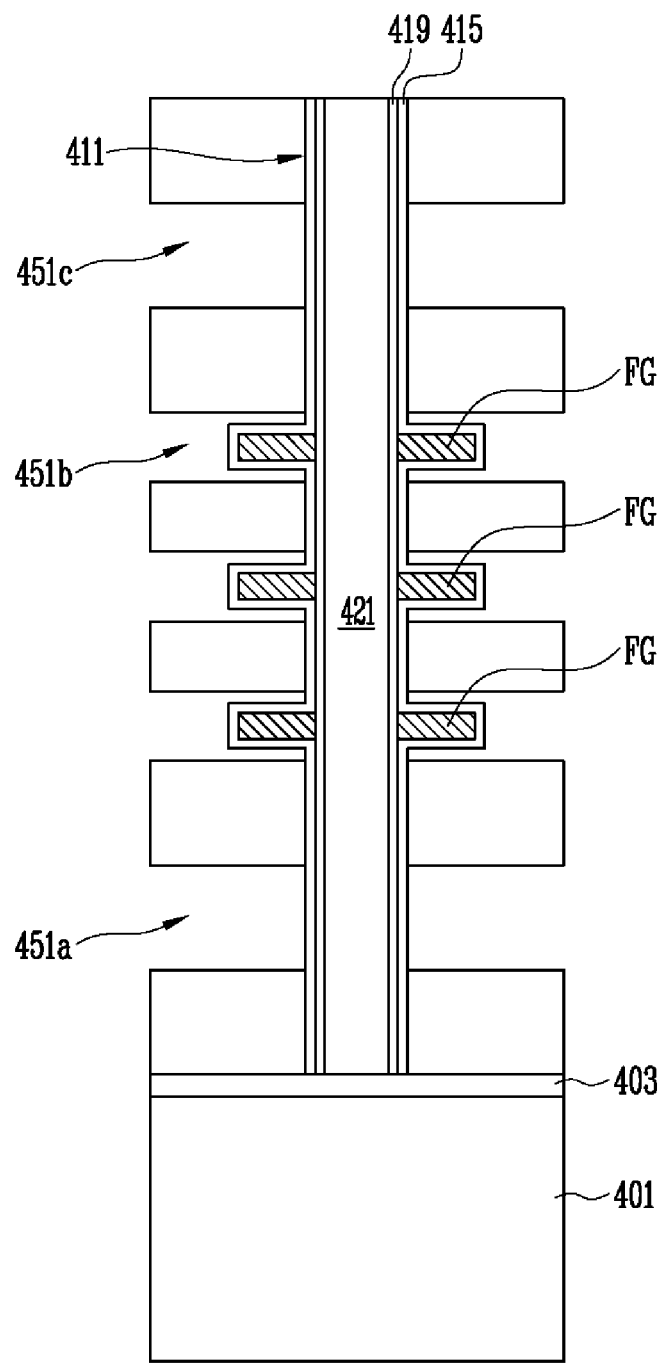

Referring to FIG. 6C, the first material layers 407a to 407f and the second material layers 409a to 409c are removed. In this manner, second recessed regions 451a, 451b, and 451c are formed. The lowermost second recessed region 451a is a region in which the first select gate is formed, the uppermost second recessed region 451c is a region in which the second select gate is formed, and the second recessed region 451b covering the floating gate FG between the recessed regions 451a and 451c is a region in which a control gate is formed.

Figure 6D:
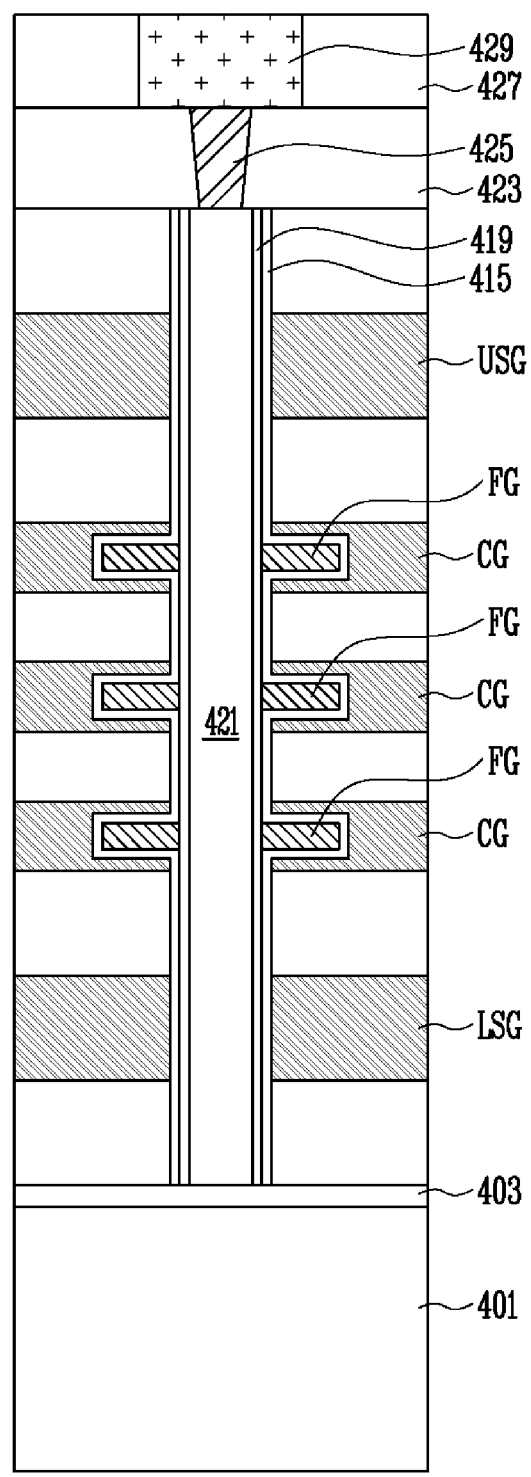

Referring to FIG. 6D, the second recessed regions 451a to 451c each are filled with a gate conductive layer. In this manner, the control gate CG is formed. The control gate CG may be formed in a single layer that covers the floating gates FG and the first and second select gates LSG and USG that cover the vertical channel layer 421.

Any conductive layer can be used as the gate conductive layer as long as it includes a polysilicon layer, a metal silicide layer, or a metal layer. However, preferably, the gate conductive layer may be formed of a metal layer such as a tungsten layer in order to reduce the resistance of each of the control gate CG and the first and second select gates LSG and USG.

After a sixth interlayer insulating layer 423 is formed over the entire structure having the vertical channel layer 421 thereon, a bit line contact plug 425 that passes through the sixth interlayer insulating layer 423 and is coupled to the vertical channel layer 421 is formed. The sixth interlayer insulating layer 423 is formed of an insulating material such as a silicon oxide layer. The bit line contact plug 425 may be formed of a doped silicon layer, a metal layer or a metal silicide layer.

Subsequently, after a seventh interlayer insulating layer 427 is formed over the entire structure having the bit line contact plug 425 thereon is formed, a bit line 429 is formed. The bit line 429 may pass through the seventh interlayer insulating layer 427 and may be coupled to the bit line contact plug 425. The seventh interlayer insulating layer 427 is formed of an insulating material such as a silicon oxide layer, the bit line 429 is formed of a conductive material.

As described above, the dielectric layer 415 is formed before the floating gates FG are formed. However, the present invention is not limited thereto. For example, after the second recessed regions 451a to 451c, as described in connection with FIG. 6C, are formed, the dielectric layer 415 may be formed before the second recessed regions 451a to 451c are filled with a conductive layer.

Figure 7:
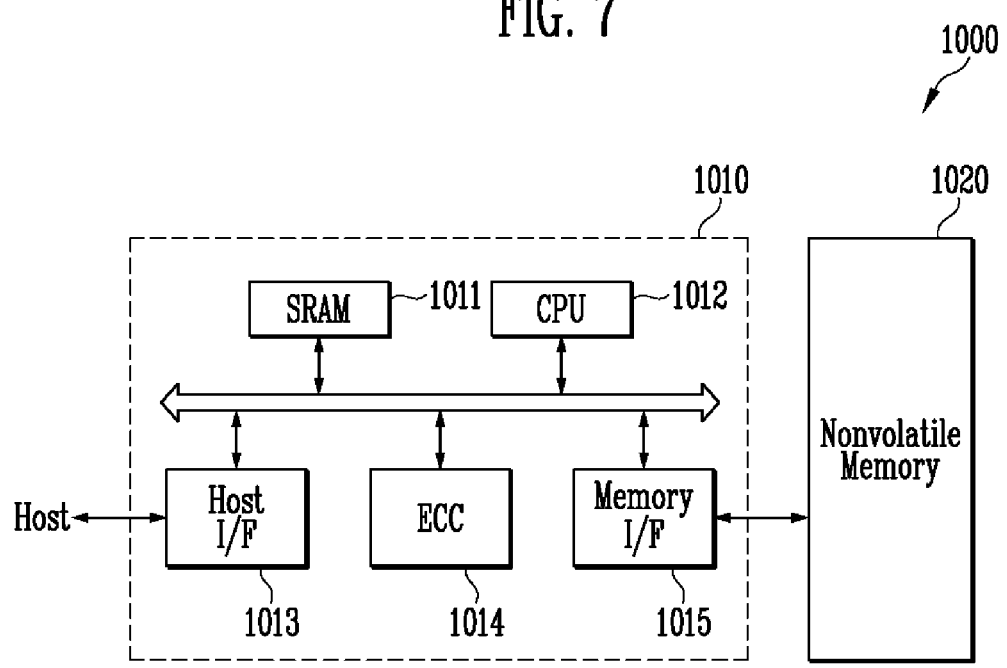
FIG. 7 is a schematic block diagram of a memory system according to an embodiment of the present invention.

FIG. 7 is a schematic block diagram of a memory system according to an embodiment of the present invention.

Referring to FIG. 7, a memory system 1000 according to an embodiment of the present invention includes a memory device 1020 and a memory controller 1010.

The memory device 1020 includes at least one of the memory devices manufactured by using the manufacturing methods according to the first to third embodiments of the present invention. That is, the memory device 1020 includes a vertical channel layer protruding upward from a semiconductor substrate; a tunnel insulating layer covering a sidewall of the vertical channel layer; a plurality of floating gates separated from each other and stacked one upon another along the vertical channel layer, and covering the vertical channel layer with the tunnel insulating layer interposed therebetween; a plurality of control gates covering the plurality of floating gates, respectively; and an interlayer insulating layer formed between the plurality of control gates.

The memory controller 1010 controls data exchange between a host and the memory device 1020. The memory controller 1010 may include a processing unit 1012 that controls the general operation of the memory system 1000. In addition, the memory controller 1010 may include an SRAM 1011 that is used as an operating memory of the processing unit 1012. The memory controller 1010 may further include a host interface 1013 and a memory interface 1015. The host interface 1013 may include a data exchange protocol between the memory system 1000 and the host. The memory interface 1015 may couple the memory controller 1010 and the memory device 1020 to each other. The memory controller 1010 may further include an error correction code (ECC) block 1014. The ECC block 1014 may detect and correct an error in data read from the memory device 1020. Though not shown in FIG. 7, the memory system 1000 may further include a ROM device that stores code data for communication to/from the host interface 1013. The memory system 1000 may be used as a portable data storage card. Also, the memory system 1000 may be implemented using a Solid State Disk (SSD) that may substitute the hard disk of a computer system.

Embodiments of the present invention provide a floating gate type three-dimensional NAND flash memory device. Accordingly, erase speed and data retention characteristics of a three-dimensional semiconductor memory device can be similar to those of a two-dimensional floating-gate NAND flash memory device.

In addition, according to embodiments of the present invention, a floating gate is surrounded by a control gate such that top and bottom surfaces and a sidewall of the floating gate may face the control gate, thereby increasing a coupling ratio between the control gate and the floating gate. Accordingly, in the present invention, the size of the floating gate can be reduced.

In addition, according to embodiments of the present invention, the operation of memory cells is controlled by a structure in which a single control gate is coupled to a single memory cell, thereby simplifying operating conditions of the memory cells.

Moreover, according to embodiments of the present invention, floating gates are not disposed between a plurality of control gates, so that spaces between the plurality of control gates can be widened to reduce disturbance.

What is claimed is:

1. A semiconductor device, comprising:
   a vertical channel layer protruding upward from a semiconductor substrate;
   a tunnel insulating layer covering a sidewall of the vertical channel layer;
   a floating gate surrounding the vertical channel layer with the tunnel insulating layer interposed therebetween; and
   a control gate including first conductive layers disposed over and under the floating gate while interposing the floating gate, and a second conductive layer covering a sidewall of the floating gate between the first conductive layers,
   wherein the first and second conductive layers are formed of different materials having an etch selectivity therebetween.

2. The semiconductor device of claim 1, further comprising a dielectric layer provided between the floating gate and the control gate.

3. The semiconductor device of claim 1, wherein the first conductive layers include doped silicon, and the second conductive layer includes undoped silicon.

4. The semiconductor device of claim 1, wherein the first conductive layers include undoped silicon, and the second conductive layer includes doped silicon.

5. The semiconductor device of claim 1, further comprising a select gate surrounding the vertical channel layer over or under the control gate and formed of the different materials from the second conductive layer.

6. The semiconductor device of claim 1, wherein the first conductive layers include polysilicon, metal or metal silicide.

7. The semiconductor device of claim 1, wherein the second conductive layer includes polysilicon, metal or metal silicide.

* * * * *